(12) United States Patent
Sampei

(10) Patent No.: US 10,811,566 B2
(45) Date of Patent: Oct. 20, 2020

(54) LIGHT EMITTING DEVICE, METHOD FOR PRODUCING LIGHT EMITTING DEVICE, AND LIGHT EMITTING MODULE

(71) Applicant: LG INNOTEK CO., LTD., Seoul (KR)

(72) Inventor: Tomohiro Sampei, Seoul (KR)

(73) Assignee: LG INNOTEK CO., LTD., Seoul (KR)

(\*) Notice: Subject to any disclaimer, the term of this patent is extended or adjusted under 35 U.S.C. 154(b) by 11 days.

(21) Appl. No.: 15/765,213

(22) PCT Filed: Sep. 29, 2016

(86) PCT No.: PCT/KR2016/010920
§ 371 (c)(1),
(2) Date: Mar. 30, 2018

(87) PCT Pub. No.: WO2017/057927
PCT Pub. Date: Apr. 6, 2017

(65) Prior Publication Data
US 2018/0294380 A1 Oct. 11, 2018

(30) Foreign Application Priority Data

Oct. 1, 2015 (KR) .................. 10-2015-0138458

(51) Int. Cl.
*H01L 33/36* (2010.01)
*H01L 25/16* (2006.01)
(Continued)

(52) U.S. Cl.
CPC ............ *H01L 33/36* (2013.01); *H01L 25/167* (2013.01); *H01L 33/50* (2013.01); *H01L 33/60* (2013.01);
(Continued)

(58) Field of Classification Search
CPC ....... H01L 33/36; H01L 25/167; H01L 33/50; H01L 33/60; H01L 33/62; H01L 33/64; H01L 33/64289
(Continued)

(56) References Cited

U.S. PATENT DOCUMENTS 7,301,781 B2 * 11/2007 Konishi .............. H01L 23/3121
257/E23.105
7,626,829 B2 * 12/2009 Watanabe .......... H01L 23/49816
361/767
(Continued)

FOREIGN PATENT DOCUMENTS

| CN | 1206464 A | 1/1999 |
| CN | 102713430 A | 10/2012 |

(Continued)

OTHER PUBLICATIONS

International Search Report (PCT/ISA/210) issued in PCT/KR2016/010920, dated Jan. 20, 2017.

*Primary Examiner* — Ori Nadav
(74) *Attorney, Agent, or Firm* — Birch, Stewart, Kolasch & Birch, LLP

(57) ABSTRACT

A light emitting module according to an embodiment comprises: a first support member having a first opening part and a second opening part; a second support member disposed in the first opening part in the first support member; a third support member disposed in the second opening part in the first support member; a first lead electrode disposed above the second support member; a second lead electrode disposed on the first support member and/or above the second support member; a light emitting chip disposed above the second support member and electrically connected to the first and second lead electrodes; a control component disposed above the third support member; and a conductive layer disposed underneath the first, second and third support (Continued)

members, wherein the first support member comprises a resin material, the second support material comprises a ceramic material and the third support member comprises a metal material.

20 Claims, 17 Drawing Sheets

(51) Int. Cl.
    *H01L 33/64*     (2010.01)
    *H01L 33/50*     (2010.01)
    *H01L 33/60*     (2010.01)
    *H01L 33/62*     (2010.01)

(52) U.S. Cl.
    CPC ............. *H01L 33/62* (2013.01); *H01L 33/64* (2013.01); *H01L 33/642* (2013.01); *H01L 2224/48091* (2013.01)

(58) Field of Classification Search
    USPC .......................................................... 257/98
    See application file for complete search history.

(56) References Cited

U.S. PATENT DOCUMENTS

| | | | |
|---|---|---|---|
| 8,193,604 B2* | 6/2012 | Lin | H01L 23/49816 257/531 |
| 8,687,380 B2* | 4/2014 | Aoyama | H05K 1/142 174/255 |
| 2001/0029062 A1* | 10/2001 | Hashimoto | H01L 23/49572 438/110 |
| 2006/0261364 A1 | 11/2006 | Suehiro et al. | |
| 2009/0052150 A1* | 2/2009 | Kobayashi | H05K 3/28 361/767 |
| 2009/0311810 A1* | 12/2009 | Yang | H05K 1/0203 438/28 |
| 2010/0177519 A1 | 7/2010 | Schlitz | |
| 2011/0316147 A1* | 12/2011 | Shih | H01L 21/486 257/737 |
| 2012/0168206 A1 | 7/2012 | Sekine et al. | |
| 2012/0287602 A1* | 11/2012 | Urano | F21S 4/20 362/84 |
| 2013/0044477 A1 | 2/2013 | Lee et al. | |
| 2013/0271992 A1 | 10/2013 | Kim et al. | |
| 2015/0177447 A1 | 6/2015 | Woodgate et al. | |
| 2015/0280076 A1 | 10/2015 | Schricker et al. | |

FOREIGN PATENT DOCUMENTS

| | | |
|---|---|---|
| CN | 103119735 A | 5/2013 |
| CN | 104022207 A | 9/2014 |
| CN | 203910851 U | 10/2014 |
| CN | 104904010 A | 9/2015 |
| CN | 102954418 A | 3/2016 |
| EP | 2101550 A1 | 9/2009 |
| GB | 2467797 A | 8/2010 |
| JP | 2006-60004 A | 3/2006 |
| JP | 2009-140717 A | 6/2009 |
| JP | 2012-209537 A | 10/2012 |
| JP | 5625706 B2 | 11/2014 |
| KR | 10-2005-0116373 A | 12/2005 |
| KR | 10-2011-0046728 A | 5/2011 |
| KR | 10-1049698 B1 | 7/2011 |
| KR | 10-2012-0072689 A | 7/2012 |
| KR | 10-2012-0115385 A | 10/2012 |
| KR | 10-2012-0121704 A | 11/2012 |
| KR | 10-2013-0032202 A | 4/2013 |
| TW | 200913844 A | 3/2009 |
| WO | WO 2015/073438 A1 | 5/2015 |

* cited by examiner

【Figure 1】
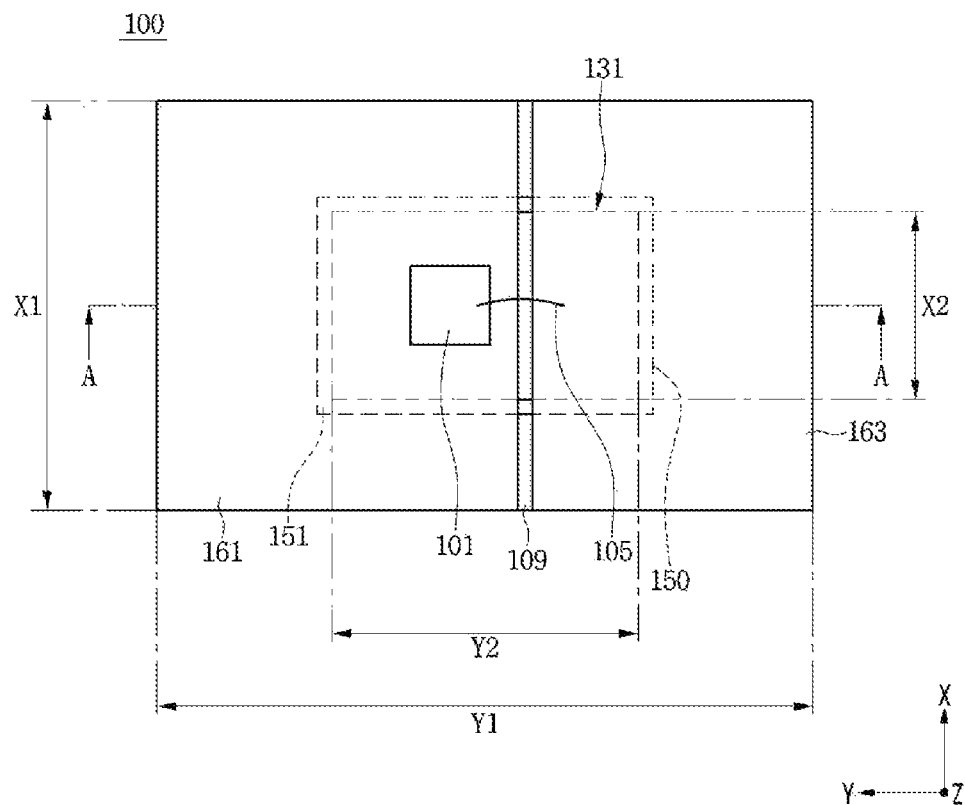
【Figure 2】
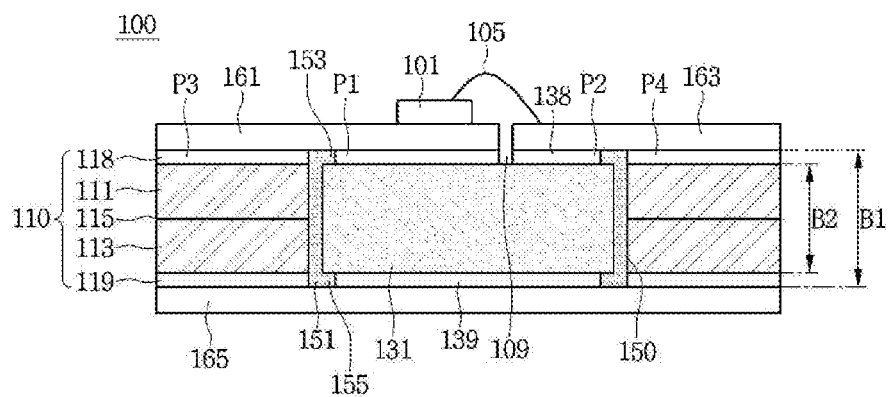

[Figure 3]
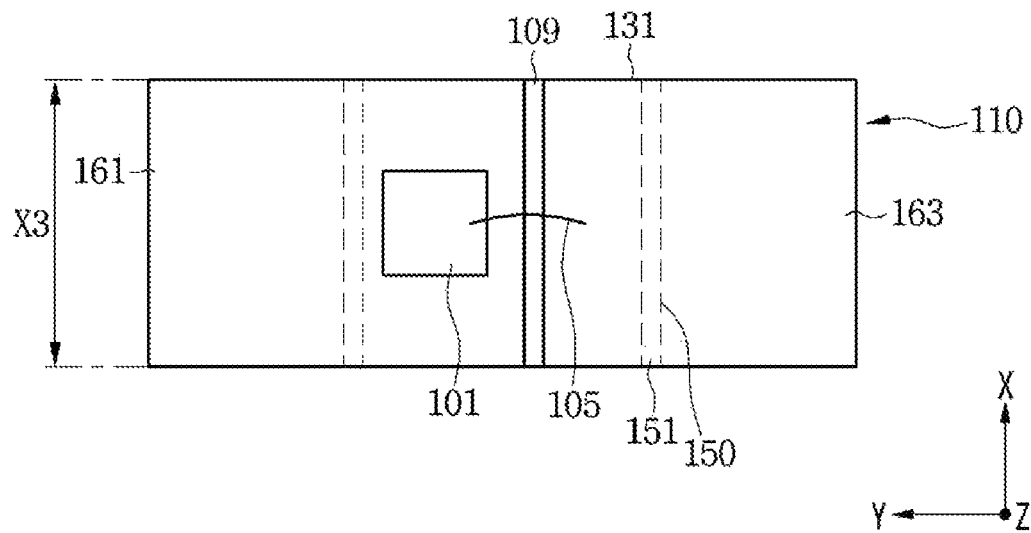
[Figure 4]
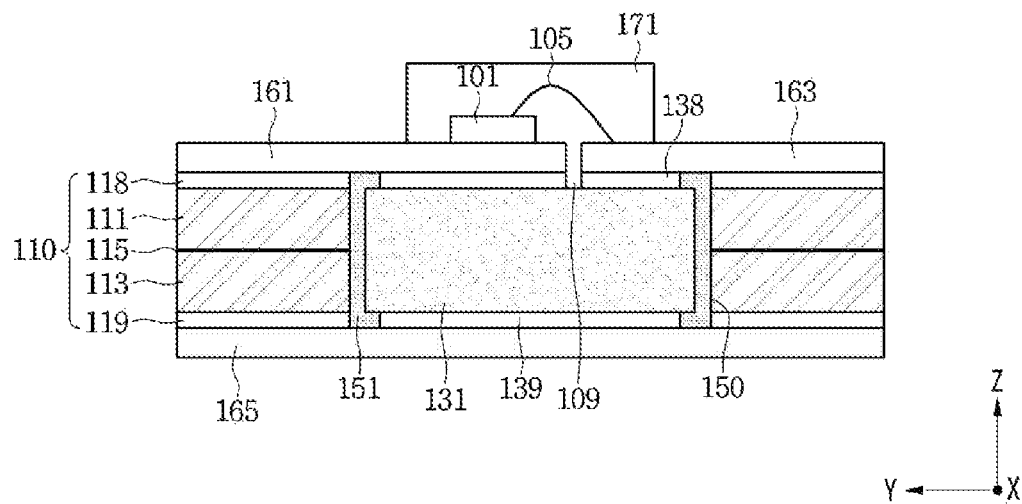

[Figure 5]
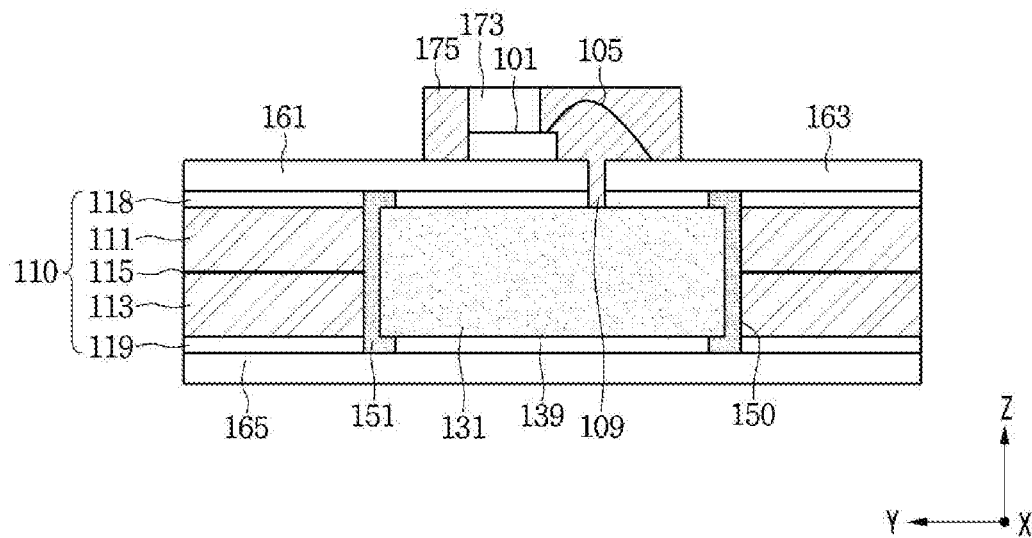
[Figure 6]
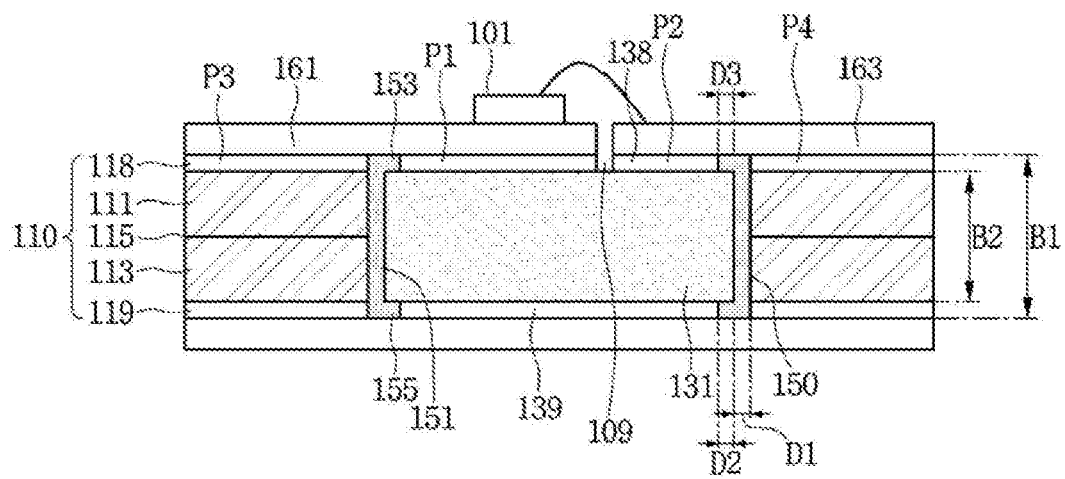

【Figure 7】
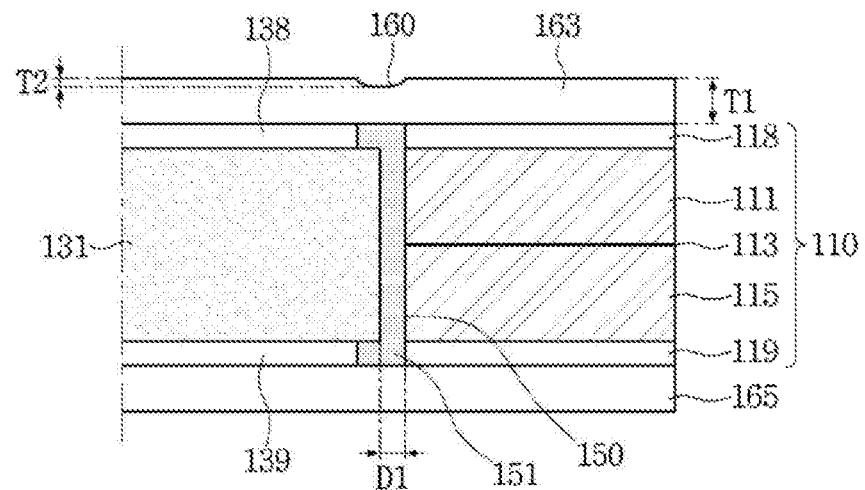
【Figure 8】
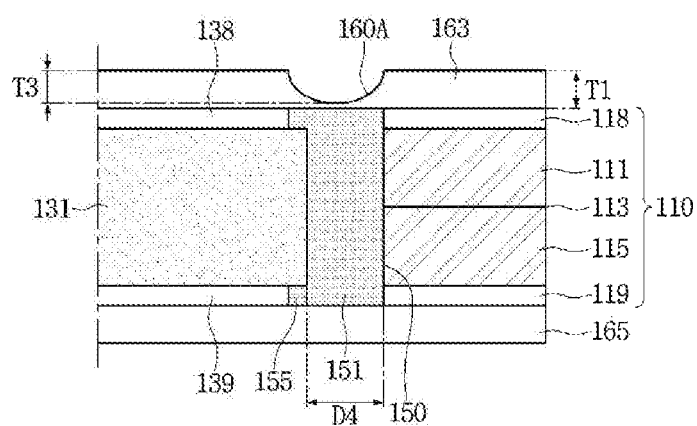

【Figure 9】
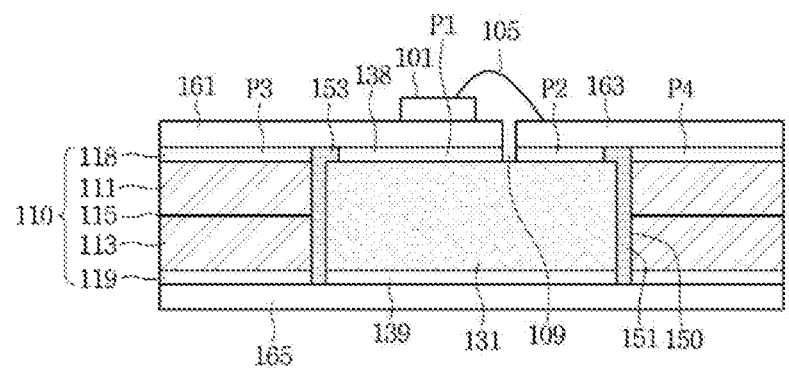
【Figure 10】
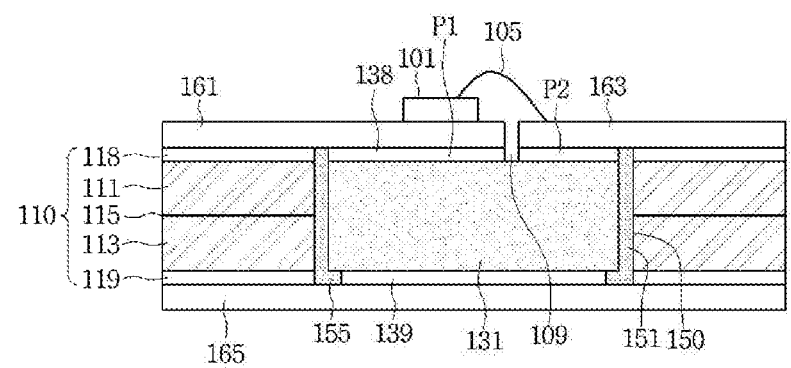
【Figure 11】
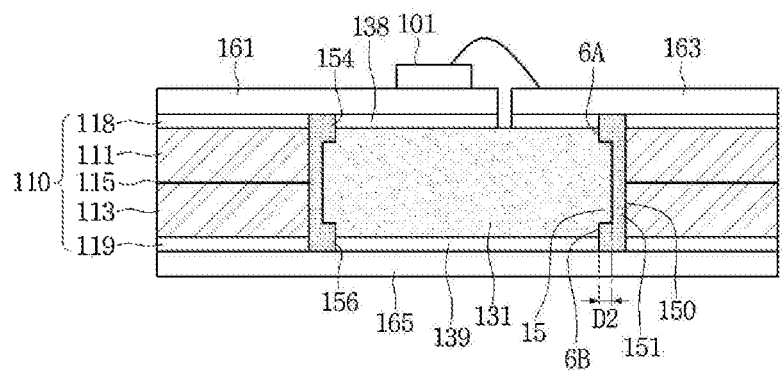

【Figure 12】
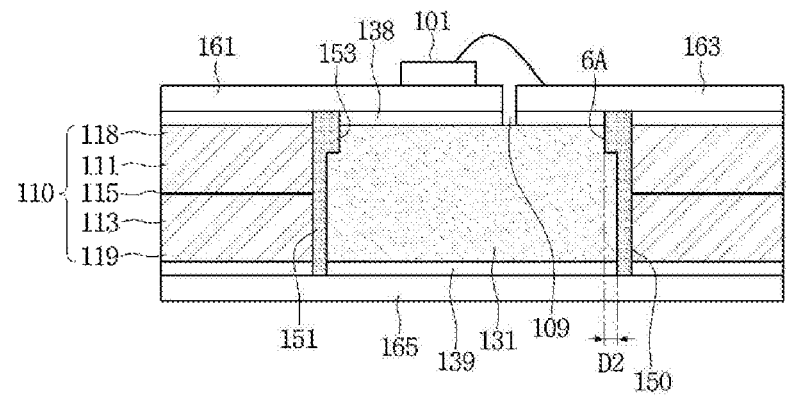
【Figure 13】
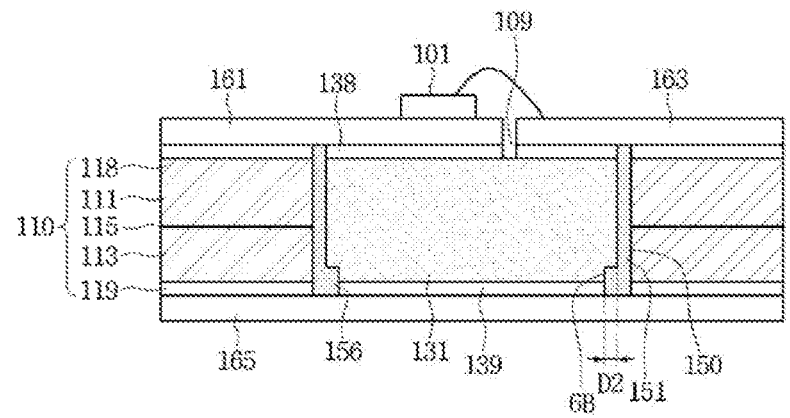
【Figure 14】
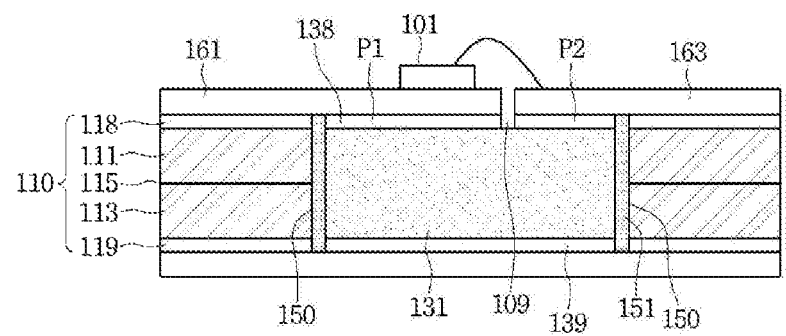

[Figure 15]
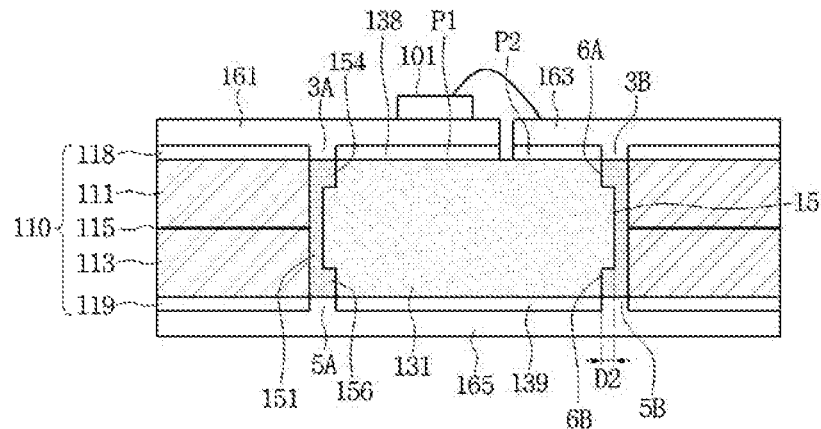
[Figure 16]
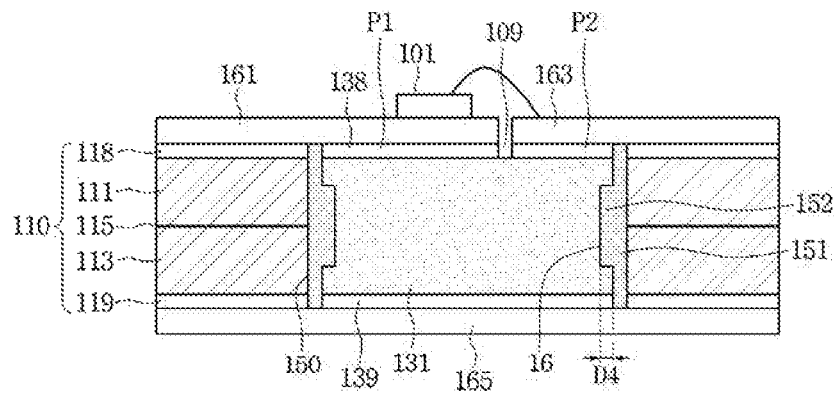
[Figure 17]
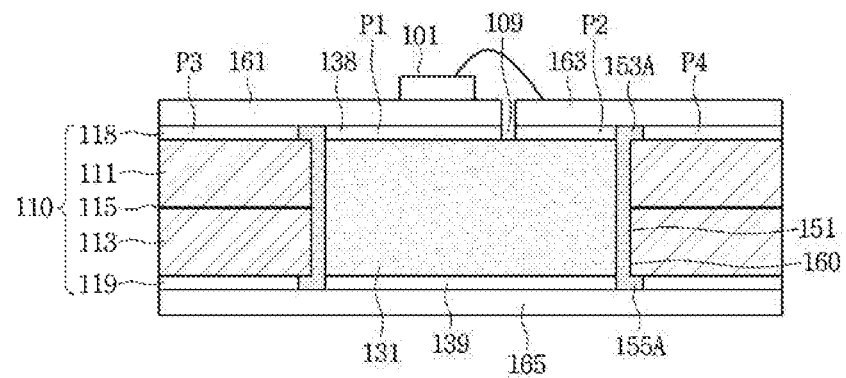

[Figure 18]
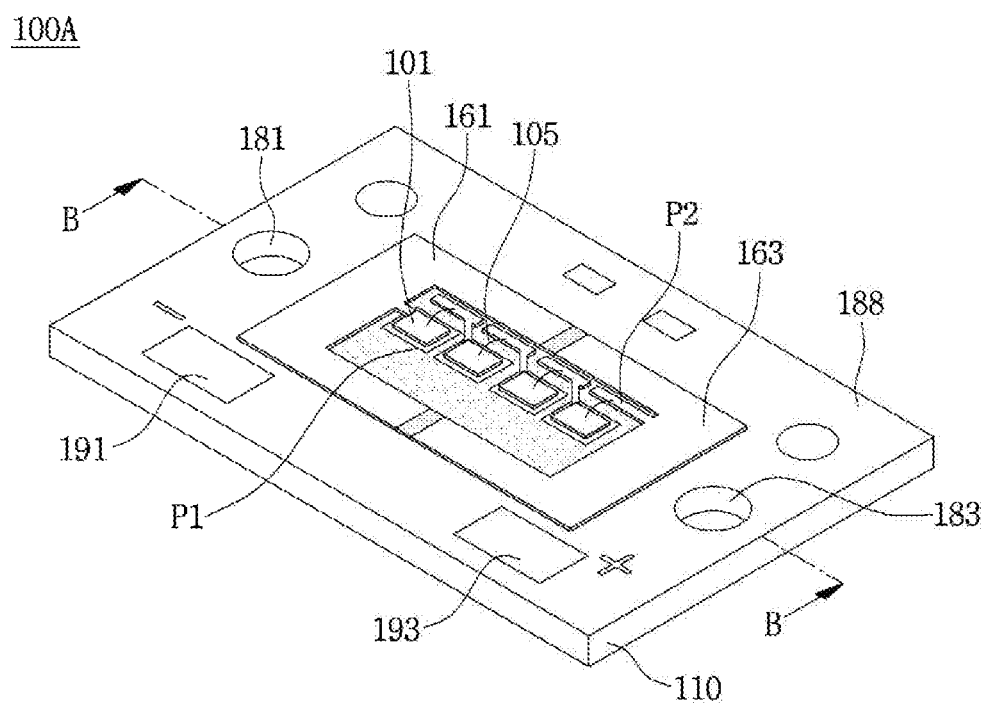

[Figure 19]
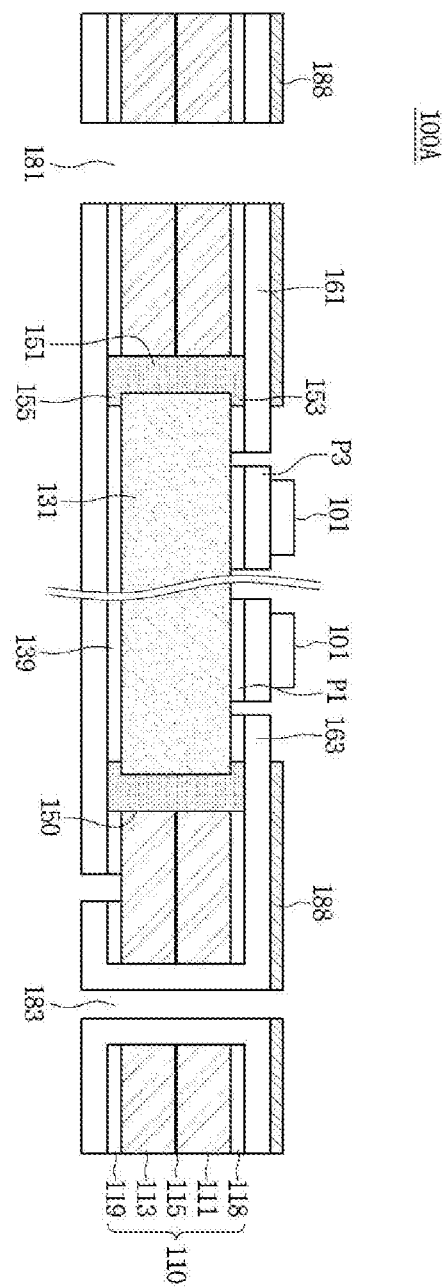

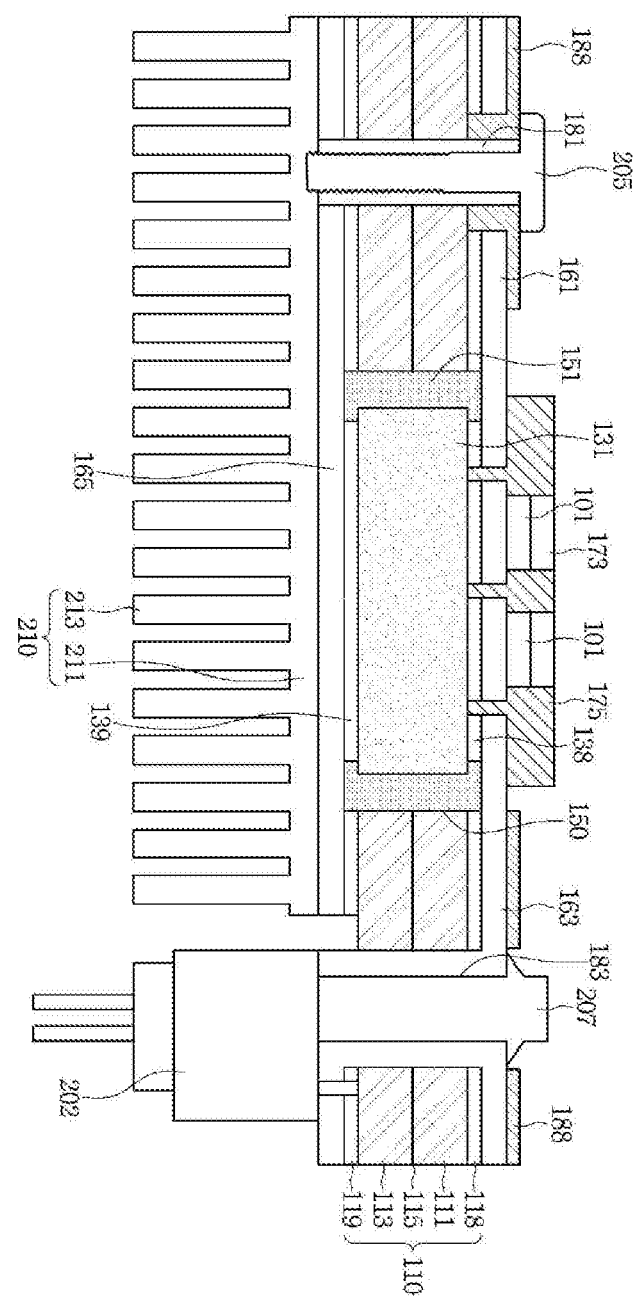
[Figure 20]

[Figure 21]
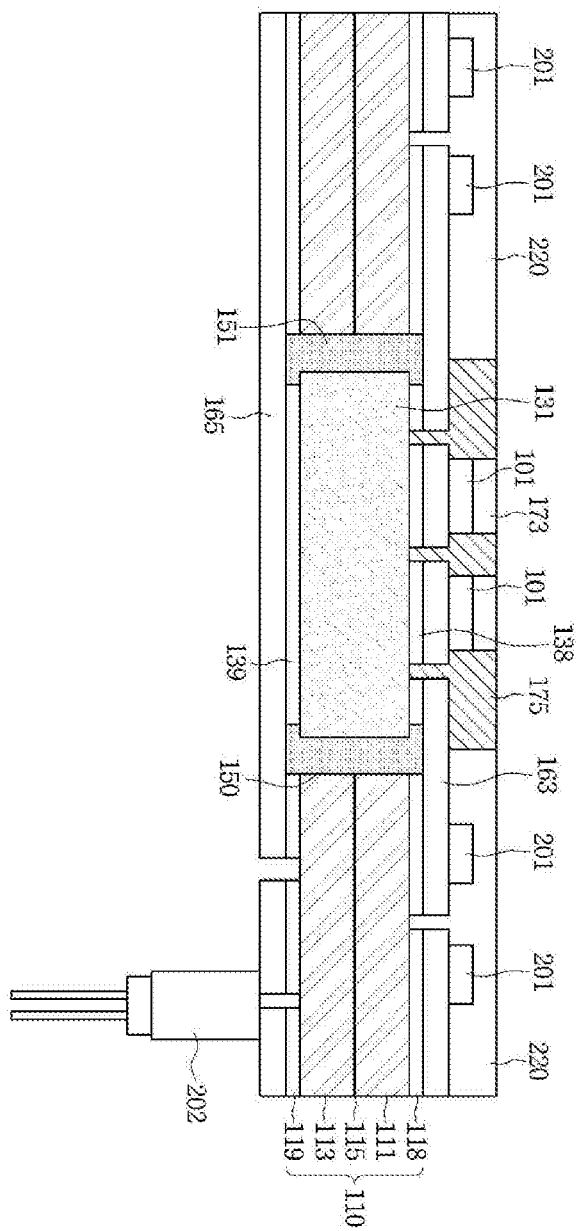

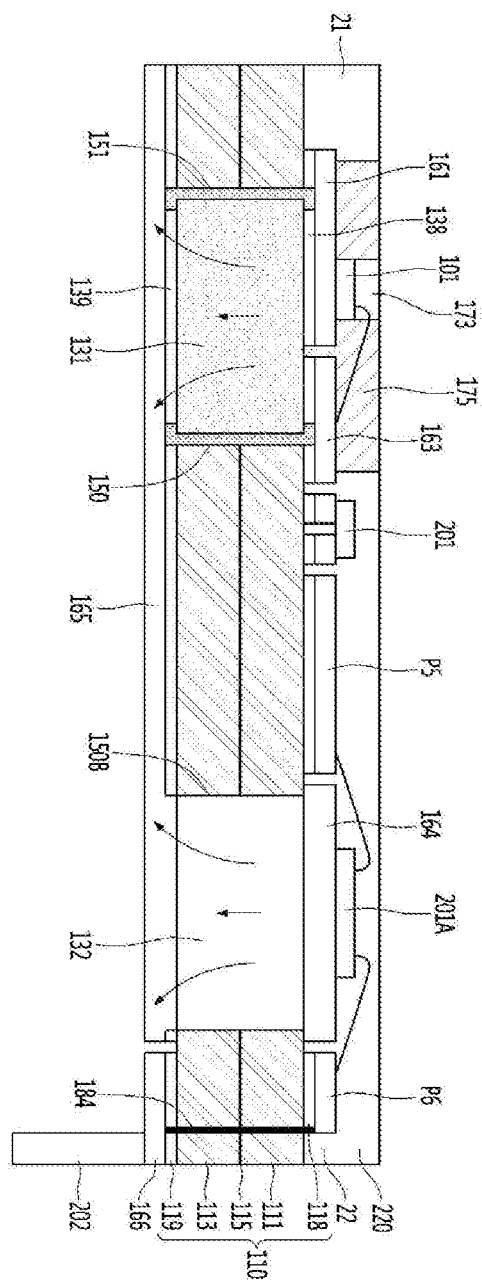
[Figure 22]

【Figure 24】
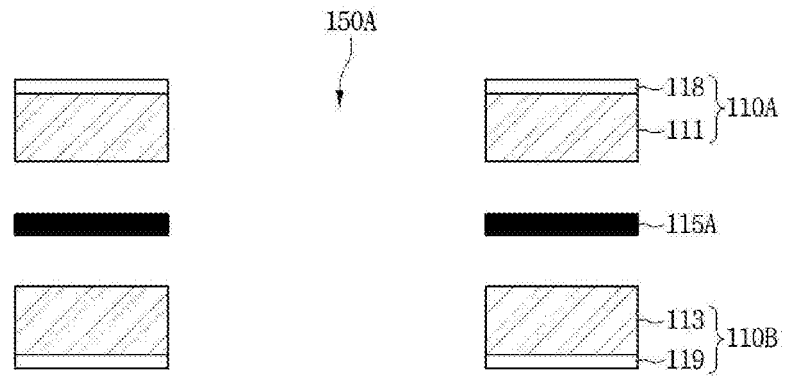
【Figure 25】
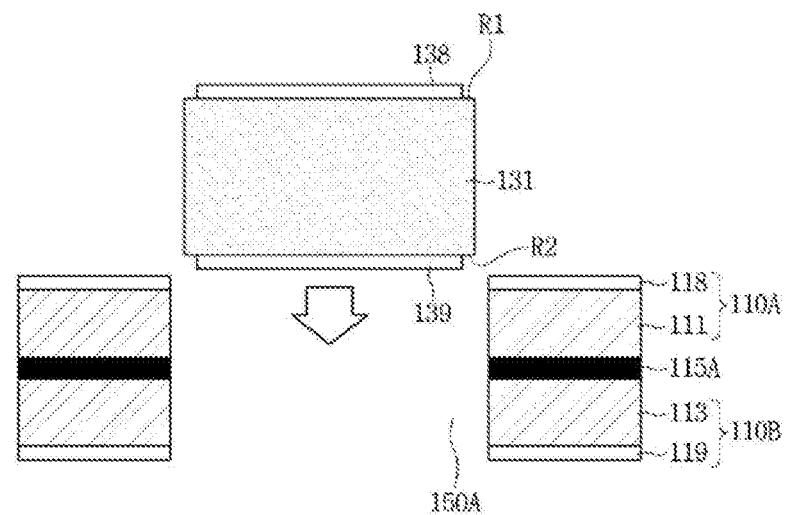
【Figure 26】
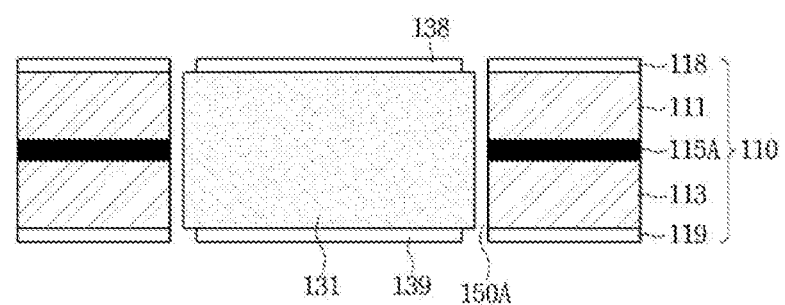

【Figure 27】
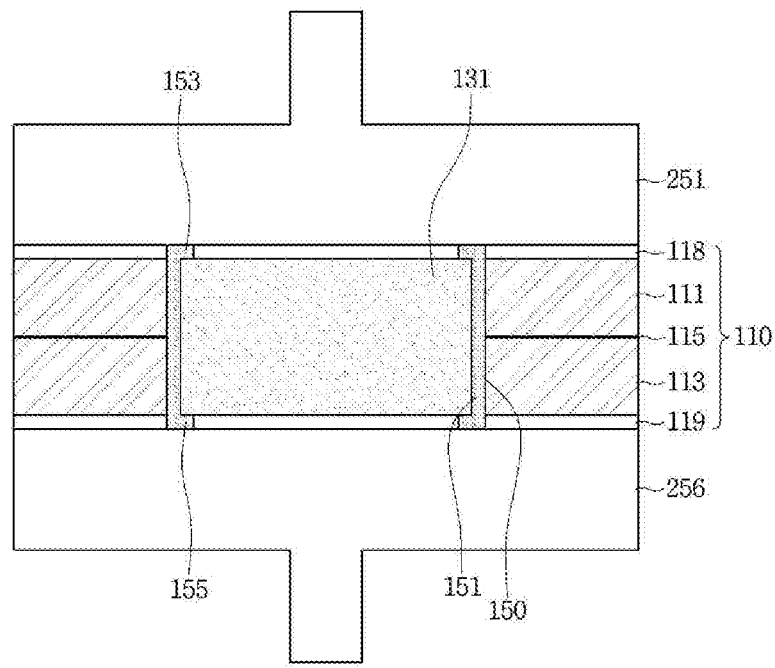
【Figure 28】
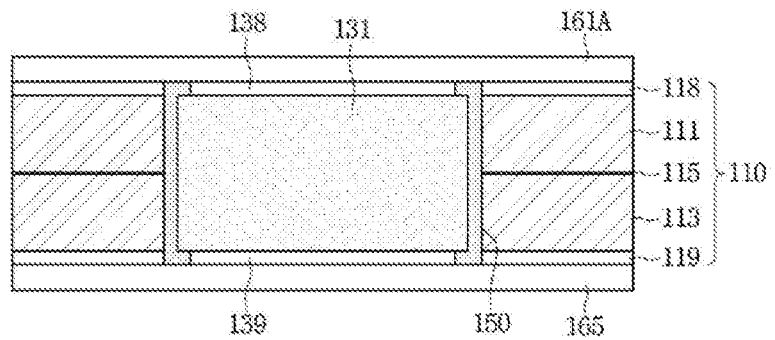

[Figure 29]
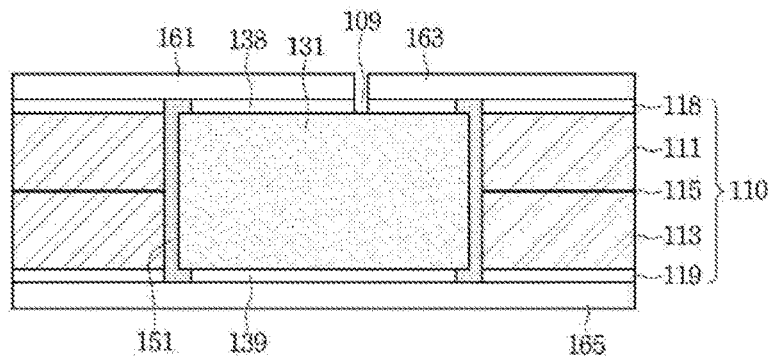
[Figure 30]
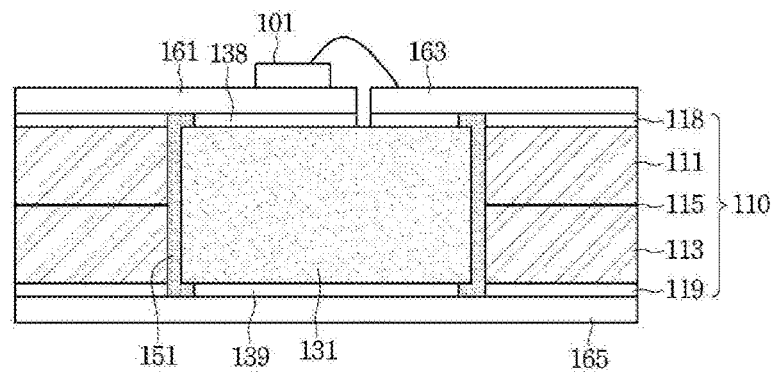
[Figure 31]
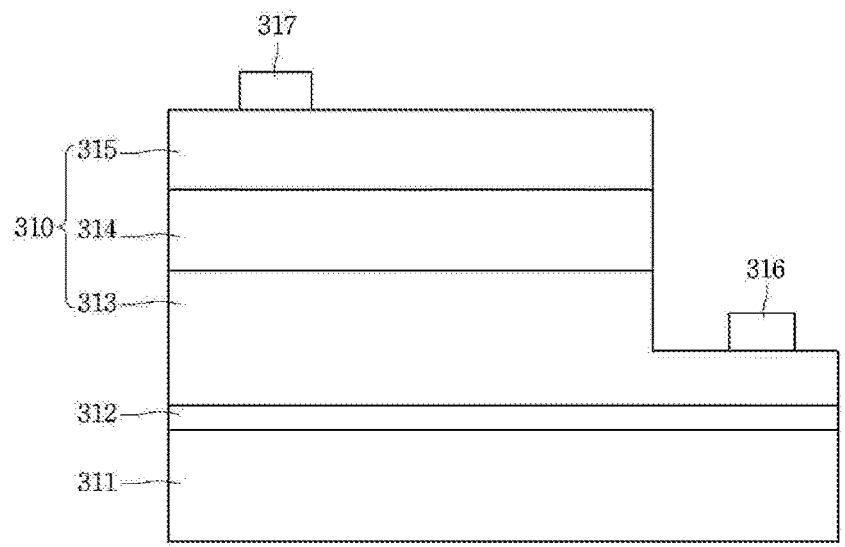

[Figure 32]
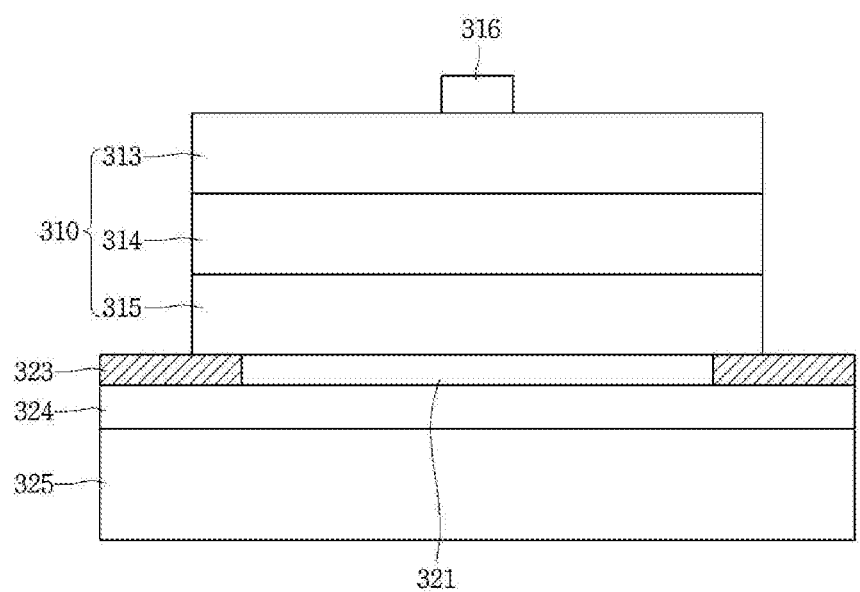

LIGHT EMITTING DEVICE, METHOD FOR PRODUCING LIGHT EMITTING DEVICE, AND LIGHT EMITTING MODULE

CROSS REFERENCE TO RELATED APPLICATIONS

This application is the National Phase of PCT International Application No. PCT/KR2016/010920, filed on Sep. 29, 2016, which claims priority under 35 U.S.C. 119(a) to Patent Application No. 10-2015-0138458, filed in the Republic of Korea on Oct. 1, 2015, all of which are hereby expressly incorporated by reference into the present application.

TECHNICAL FIELD

Embodiments relate to a light emitting device.
Embodiments relate to a method of manufacturing a light emitting device.
Embodiment relate to a light emitting module having a light emitting device.
Embodiment relate to a lighting device or a display device having a light emitting device or a light emitting module.

BACKGROUND ART

Light emitting devices, such as light emitting diodes are semiconductor devices that convert electrical energy into light, and have come into the spotlight as a next-generation light source that replace fluorescent lamps and incandescent lamps.

The light emitting diodes generate light using semiconductor devices, and thus consume only very low power, as compared with the incandescent lamps that generate light by heating tungsten or the fluorescent lamps that generate light by allowing ultraviolet light generated through high-pressure discharge to collide with a phosphor.

The light emitting diodes are being increasingly used as light sources of lighting devices such as indoor and outdoor lamps, liquid crystal displays, electronic boards, and streetlights.

DISCLOSURE

Technical Problem

Embodiments provide a light emitting device having a new heat dissipation structure.

Embodiments provide a light emitting device in which a support member having low thermal resistance is disposed in an opening of a resin member and a light emitting chip is disposed on the support member having low thermal resistance.

Embodiments provide a light emitting device in which a first support member made of a resin material and a second support member made of a ceramic material are adhered to each other and one or a plurality of light emitting chips is disposed on the second support member, and a light emitting module including the same.

Embodiments provide a light emitting device in which a lead electrode is disposed between a second support member and a light emitting chip, and a light emitting module including the same.

Embodiments provide a light emitting device in which a second support member is adhered to an opening of a first support member using an adhesion layer, and a method of manufacturing the same.

Embodiments provide a light emitting module in which a second support member made of a ceramic material for insulation and heat dissipation of a light emitting chip is disposed in a first support member and a third support member made of a metal material for non-insulation and heat dissipation of control parts is disposed.

Technical Solution

A light emitting module according to an embodiment includes a first support member having a first opening and a second opening, a second support member disposed in the first opening of the first support member, a third support member disposed in the second opening of the first support member, a first lead electrode disposed on the second support member, a second lead electrode disposed on at least one of the first and second support members, a light emitting chip disposed on the second support member and electrically connected to the first and second lead electrodes, a control part disposed on the third support member, and a conductive layer disposed under the first, second and third support members. The first support member includes a resin material, the second support member includes a ceramic material, and the third support member includes a metal material.

A light emitting module according to an embodiment includes a first support member having a first opening and a second opening penetrated vertically, a second support member disposed in the first opening of the first support member, a third support member disposed in the second opening of the first support member, an adhesive member disposed in the first and second openings, a first lead electrode disposed on the second support member, a second lead electrode disposed on at least one of the first and second support members, a light emitting chip disposed on the second support member and electrically connected to the first and second lead electrodes, a control part disposed on the third support member, and a heat dissipation patter disposed between the third support member and the control part. The first support member includes a resin material, the second support member includes a ceramic material, the third support member includes a metal material, the first support member has a multi-layer structure formed of different materials, and the second and third support members have less thicknesses than the first support member.

According to embodiments, the conductive layer may be connected to the second and third support members.

According to embodiments, a heat dissipation pattern disposed between the third support member and the control part may be included, and the heat dissipation pattern may be electrically separated from the control part.

According to embodiments, at least one of a phosphor layer disposed on the light emitting chip, a reflecting member disposed around the light emitting chip and formed of a resin material and a protecting member disposed around the reflecting member and formed of a resin material may be included.

According to embodiments, a first adhesive member disposed in the first opening and adhered between the first support member and the second support member may be included, the first adhesive member may be in contact with the first lead electrode and the conductive layer, and the first adhesive member may include at least one of a first adhesive part disposed in an outer part of an upper surface of the second support member and a second adhesive part disposed in an outer part of a lower surface of the second support member.

According to embodiments, a second adhesive member disposed in the second opening and adhered between the first support member and the third support member may be included.

According to embodiments, the first support member may include a first resin layer, a second resin layer disposed below the first resin layer, an adhesive layer disposed between the first and second resin layers, a first metal layer disposed on the first resin layer and a second metal layer disposed below the second resin layer, and the adhesive layer may be connected to the first adhesive member.

According to embodiments, the adhesive layer and the adhesive member may include the same material, and the second support member may include aluminum nitride, silicon carbide, alumina, zirconium oxide and boron nitride.

According to embodiments, a heat dissipation plate having a plurality of heat dissipation fins under the conductive layer may be included.

According to embodiments, the adhesive member may include a first adhesive member disposed in the first opening and adhered between the first support member and the second support member and a second adhesive member disposed in the second opening and adhered between the first support member and the third support member, the first adhesive member may vertically overlap the second support member, and the second adhesive member may vertically overlap the third support member.

Advantageous Effects

Embodiments can improve heat dissipation efficiency of a light emitting chip and a light emitting device.

Embodiments provide a light emitting device having a second support member having a light emitting chip disposed thereon and made of a ceramic material in an opening of a first support member made of a resin material.

Embodiments can improve heat dissipation efficiency by disposing metal layers on upper and lower surfaces of a support member having a light emitting chip disposed thereon and made of a ceramic material.

Embodiments can provide a light emitting device having improved heat dissipation efficiency.

Embodiments can provide a light emitting device having a small thickness, by disposing a support member made of a ceramic material in an opening of a support member made of a resin material.

Embodiments can improve heat dissipation properties according to the types of chips and parts, by disposing different heat dissipation members for insulation and non-insulation in a resin substrate.

Embodiments can improve reliability of a light emitting device and a light emitting module including the same.

DESCRIPTION OF DRAWINGS

FIG. 1 is a plan view showing a light emitting device according to a first embodiment.

FIG. 2 is a sectional view taken along line A-A of the light emitting device of FIG. 1.

FIG. 3 is a view showing another example of the light emitting device of FIG. 1.

FIG. 4 shows a first modification of the light emitting device of FIG. 2.

FIG. 5 shows a second modification of the light emitting device of FIG. 2.

FIG. 6 shows a detailed configuration of the light emitting devices of FIG. 5.

FIG. 7 is a view showing a surface state of a lead electrode located on the adhesive member in the light emitting devices of FIG. 5.

FIG. 8 is a view showing a surface state of the lead electrode as the thickness of the adhesive member increases in the light emitting devices of FIG. 5.

FIG. 9 shows a first modification of the adhesive member of the light emitting device of FIG. 5.

FIG. 10 shows a second modification of the adhesive member of the light emitting device of FIG. 5.

FIG. 11 shows a third modification of the adhesive member of the light emitting device of FIG. 5.

FIG. 12 shows a fourth modification of the adhesive member of the light emitting device of FIG. 5.

FIG. 13 shows a fifth modification of the adhesive member of the light emitting device of FIG. 5.

FIG. 14 shows a sixth modification of the adhesive member of the light emitting device of FIG. 5.

FIG. 15 shows a seventh modification of the adhesive member of the light emitting device of FIG. 5.

FIG. 16 shows an eighth modification of the adhesive member of the light emitting device of FIG. 5.

FIG. 17 shows a ninth modification of the adhesive member of the light emitting device of FIG. 5.

FIG. 18 is a view showing a light emitting module having a light emitting device according to a second embodiment.

FIG. 19 is a side sectional view of the light emitting module of FIG. 18.

FIG. 20 shows a first modification of the light emitting module of FIG. 18.

FIG. 21 shows a second modification of the light emitting module of FIG. 18.

FIG. 22 is a side cross-sectional view showing a light emitting module according to a second embodiment.

FIGS. 24 to 30 are views showing a manufacturing process of the light emitting device of FIG. 2.

FIG. 31 is a view showing an example of a light emitting chip according to an embodiment.

FIG. 32 is a view showing another example of the light emitting chip according to the embodiment.

BEST MODE

Figure 23:
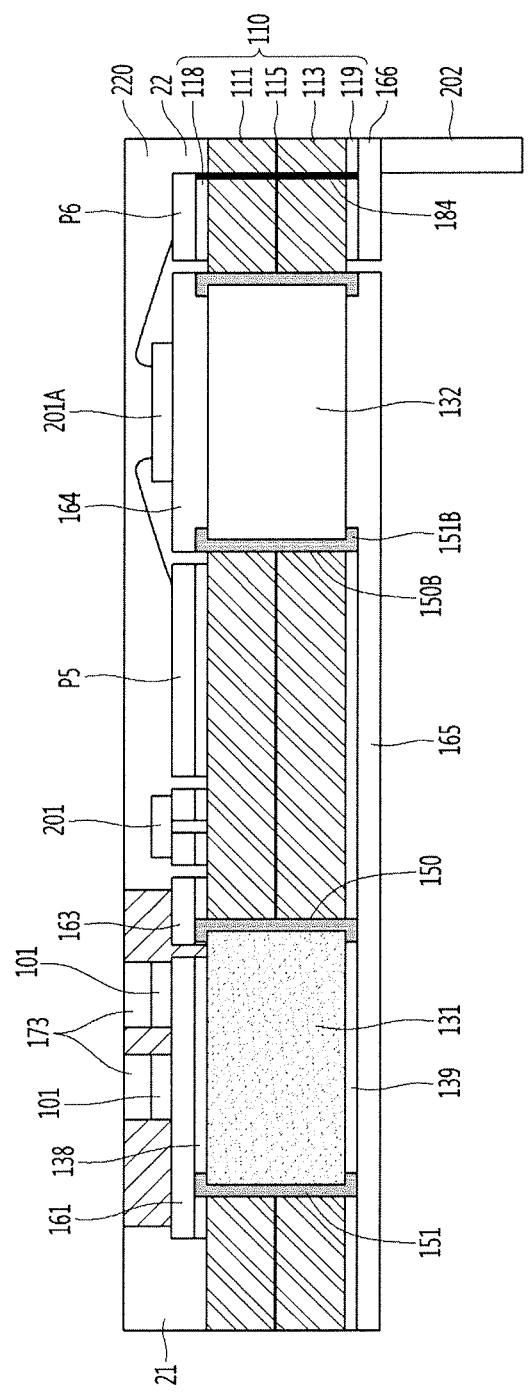
FIG. 23 is a diagram showing another example of the light emitting module of FIG. 22.

In the following description of the embodiments, it will be understood that, when a layer (film), a region, a pattern or a structure is referred to as being "on" or "under" a substrate, another layer (film), region, pad or patterns, it can be "directly" or "indirectly" on the other layer (film), region, pattern or structure, or one or more intervening layers may also be present. Such a position of each layer will be described with reference to the drawings.

Hereinafter, exemplary embodiments will be described in detail with reference to the accompanying drawings. The technical objective of embodiments is not limited to the aforementioned technical problem, and technical problems not mentioned above can be clearly understood by a person skilled in the art by the disclosure below. In the drawings, like parts and portions are designated by like reference numerals and overlapping is avoided with respect to explanation of these parts and portions.

FIG. 1 is a plan view showing a light emitting device according to a first embodiment. FIG. 2 is a sectional view taken along line A-A of the light emitting device of FIG. 1.

Referring to FIGS. 1 and 2, the light emitting device 100 includes a first support member 110 having an opening 150, a second support member 131 located in the opening 150 of the first support member 110, a light emitting chip 101 disposed on the second support member 131, a first lead electrode 161 disposed between the second support member 131 and the light emitting chip 101, a second lead electrode 163 disposed on at least one of the first and second support members 110 and 131, and a conductive layer 165 disposed under the first and second support members 110 and 131.

The light emitting chip 101 may selectively emit light in the range from a visible ray band to an ultraviolet (UV) band. The light emitting chip 101 may include, for example, at least one of a UV LED, a red LED, a blue LED, a green LED, a yellow green LED, and a white LED.

The light emitting chip 101 may include at least one of the structure of a horizontal LED chip, in which two electrodes in the chip are disposed adjacent to each other and the structure of a vertical LED chip, in which two electrodes in the chip are disposed at sides opposite to each other. In the embodiment, a vertical chip having a conductive support member may be disposed under the light emitting chip 101 to improve heat dissipation efficiency.

When the light emitting chip 101 is a vertical LED chip, the light emitting chip 101 may be connected the second lead electrode 163 through a wire 105. As another example, when the light emitting chip 101 is a horizontal LED chip, the light emitting chip 101 may be connected to the first and second lead electrodes 161 and 163 through the wire 105, but the present disclosure is not limited thereto. When the light emitting chip 101 is mounted in a flip-chip manner, the light emitting chip 101 may be bonded on the first and second lead electrodes 161 and 163. The first and second support members 110 and 131 may include different materials. The first and second support members 110 and 131 may include materials having different thermal resistances. The first support member 110 may have a multi-layer structure of different materials, and the second support member 131 may include a single material or a multi-layer structure.

The first support member 110 includes a resin material, and the second support member 131 includes a nonmetallic or ceramic material. The first support member 110 may be a resin substrate or an insulating substrate, and the second support member 131 may be a ceramic substrate or a heat dissipation substrate.

The first support member 110 may include a resin material, e.g., at least one of a fluororesin (FR)-based material and a composite epoxy material (CEM). The light emitting device 100 according to the embodiment uses the first support member 110, so that it is possible to save manufacturing cost and material cost of the light emitting device 100 and to reduce the weight of the light emitting device 100.

The second support member 131 may include a material having a higher thermal conductivity and a lower heat resistance than the resin material. The second support member 131 may be made of, for example, oxide, carbide, or nitride formed by bonding a metal element such as silicon (Si), aluminum (Al), titanium (Ti), or zirconium (Zr) to oxygen, carbon, or nitrogen. The second support member 131 may include an aluminum nitride (AlN) material. As another example, the second support member 131 may include at least one of silicon carbide (SiC), alumina ($Al_2O_3$), zirconium oxide ($ZrO_2$), silicon nitride ($Si_3N_4$), and boron nitride (BN) materials. The thermal conductivity of AlN may be 70 to 250 W/mK, the terminal conductivity of BN may be 60 to 200 W/mK, the thermal conductivity of $Si_3N_4$ may be 60 to 90 W/mk, the thermal conductivity of Si may be 150 W/mK, the thermal conductivity of SiC may be 270 W/mK, and the thermal conductivities of $Al_2O_3$ and $ZrO_2$ may be 20 to 30 W/mK. The second support member 131 may include a material having a thermal conductivity of 60 W/mK or more.

The first support member 110 includes the opening 150 as shown in FIG. 2. The opening 150 may be formed to penetrate the first support member 110 in the Z-axis direction. The top-view shape of the opening 150 may include at least one of a polygonal shape and a circular or elliptical shape, but the present disclosure is not limited thereto. Accordingly, since the second support member 131 under the light emitting chip 101 is disposed in the substrate, it is possible to secure a short heat radiation path without increasing the thickness of the light emitting device 100.

As shown in FIG. 1, a lengths Y2 or X2 in direction of the Y-axis or X-axis of the second support member 131 may be smaller than a lengths in direction of the Y-axis or X-axis in the opening 150, respectively. The Y-axis and X-axis lengths Y2 and X2 of the second support member 131 may be smaller than the Y-axis and X-axis lengths Y1 and X1 of the first support member 110, respectively. The lengths have a relation of lengths Y1>Y2, and have a relation of lengths X1>X2. Accordingly, the second support member 131 can be disposed in a region of the first support member 110. The first support member 110 surrounds the second support member 131. The first and second support members 110 and 131 may be disposed so as not to overlap with each other in the X-axis direction and the Y-axis direction. The Y-axis direction may be orthogonal to the X-axis direction, and the Z-axis direction may be orthogonal to the X- and Y-axis directions. For convenience of the embodiment, the Y-axis direction may be described as a first axial direction, the X-axis direction as a second axial direction, and the Z-axial direction as a third axial direction.

As another example, when the length of the second-axis direction of the opening 150 is equal to or smaller than a length X3 of the second-axis direction of the second support member 131 as shown in FIG. 3, two sides of the second support member 131 may not face the first support member 110. Hereinafter, for convenience of illustration, the structure in which the second support member 131 is inserted into the opening 150 as shown in FIG. 1 will be described.

Referring to FIG. 2, the first support member 110 the first support member 110 may include at least one resin layer 111 and 113, and a metal layer 118 and 119 disposed on at least one of top and bottom surfaces of the resin layer 111 and 113. The resin layer 111 and 113 may include, for example, a first resin layer 111 and a second resin layer 113. The first resin layer 111 is disposed between the second resin layer 113 and the metal layer 118, The second resin layer 113 may be disposed between the first resin layer 111 and the metal layer 119. The metal layer 118 and 119 may be disposed a first metal layer 118 on a top surface of the first resin layer 111 and a second metal layer 119 on a bottom surface of the second resin layer 113. The first metal layer 118 can contact the top surface of the first resin layer 111 and the second metal layer 119 can contact the bottom surface of the second resin layer 113. The resin layer 111 and 113 and the metal layer 118 and 119 may not overlapped with the second support member 131 in the Z-axis direction. The resin layer 111 and 113 and the metal layer 118 and 119 may have the opening 150.

The first and second resin layers 111 and 113 may include the same resin material, e.g., an FR-based material and a CEM. The first and second metal layers 118 and 119 may be formed of at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof, and may be formed in a single layer or multiple layers. As another example, the first and second resin layers 111 and 113 may be a different resin material, but the present disclosure is not limited thereto.

The first metal layer 118 may be selectively disposed at a portion or the whole of a top surface of the first support member 110 depending on a pattern shape, but the present disclosure is not limited thereto. The first metal layer 118 may be divided into electrode patterns P3 and P4 selectively connected to the different lead electrodes 161 and 163. The second metal layer 119 may be selectively disposed at a portion or the whole of a bottom surface of the first support member 110 depending on a pattern shape, but the present disclosure is not limited thereto. The second metal layer 119 may be provided as a heat radiation path or may be provided as a power supply path, but the present invention is not limited thereto.

The first support member 110 may include an adhesive layer 115 between the first and second resin layers 111 and 113. The adhesive layer 115 adheres the first and second resin layers 111 and 113 together. The adhesive layer 115 may include at least one of silicon, epoxy, and prepreg. When the first and second layers 111 and 113 are formed as a single layer, the adhesive layer 115 may be removed, but the present disclosure is not limited thereto.

Meanwhile, a metal layer 138 and 139 may be formed on at least one of top and bottom surfaces of the second support member 131. The metal layer 138 and 139 includes a third metal layer 138 disposed on the top surface of the second support member 131 and a fourth metal layer 139 disposed on the bottom surface of the second support member 131. The third metal layer 138 overlaps with the second support member 131 in the Z-axis direction and can be used as a path for transferring heat and supplying current. The third metal layer 138 may be electrically connected to the first metal layer 118. The fourth metal layer 139 overlaps with the second support member 131 in the Z-axis direction and can be used as a heat transfer path. The fourth metal layer 139 may be electrically insulated from the second metal layer 119. The third and fourth metal layers 138 and 139 may be disposed in a region where the first and second metal layers 118 and 119 do not overlap in the Z-axis direction.

The third and fourth metal layers 138 and 139 may be formed of at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof, and may be formed in a single layer or multiple layers. The second support member 131 and the third and fourth metal layers 138 and 139 may be defined as a ceramic substrate or an insulating heat dissipation substrate.

The third metal layer 138 may be spaced apart from a top edge of the second support member 131. The third metal layer 138 may be divided into at least two electrode patterns P1 and P2. The at least two patterns P1 and P2 contact the second support member 131 on the second support member 131, and may be electrically connected to the light emitting chip 101. The at least two electrode patterns P1 and P2 may be divided by a gap portion 109, but the present disclosure is not limited thereto.

The at least two electrode patterns P1 and P2 include a first electrode pattern P1 and a second electrode pattern P2, and the first electrode pattern P1 may be disposed between the light emitting chip 101 and the second support member 131. The first electrode pattern P1 may be disposed between the first lead electrode 161 and the second support member 131, and the second electrode pattern P2 may be disposed between the second lead electrode 163 and the second support member 131.

The first and second electrode patterns P1 and P2 may be spaced apart from an edge of the top surface of the second support member 131. If the first and second electrode patterns P1 and P2 exist at the top edge, the first and second electrode patterns P1 and P2 may be connected to each other along the top edge as shown in FIG. 1, and therefore, an electrical short circuit may occur.

The fourth metal layer 139 may be spaced apart from a bottom edge of the second support member 131. When the fourth metal layer 139 is an electrical wire, the fourth metal layer 139 may be spaced apart from the bottom edge of the second support member 131 so as to prevent electrical interference therebetween. Accordingly, although electrical patterns using the fourth metal layer 139 of the second support member 131 are designed, it is possible to prevent an electrical short.

The bottom area of the third metal layer 138 may be smaller than the top area of the second support member 131. The top area of the fourth metal layer 139 may be smaller than the bottom area of the second support member 131. Accordingly, electrical interference problems can be reduced and heat dissipation paths can be provided by the third and fourth metal layers 138 and 139.

Referring to FIG. 2, the thickness B1 of the first support member B1 may be thicker than the thickness B2 of the second support member 131 in the Z-axis direction. The sum of the thicknesses of the second support member 131 and the third and fourth metal layers 138 and 139 may be equal to the thickness B1 of the first support member 110, but the present disclosure is not limited thereto. The thickness B2 of the second support member 131 is formed thicker than the sum of the thicknesses of the first and second resin layers 111 and 113, and thus a sufficient heat dissipation surface area can be secured.

The adhesive member 151 is disposed between the first and second support members 110 and 131. The adhesive member 151 is adhered between the first and second support members 110 and 131. The adhesive member 151 may contact the first and second resin layers 111 and 113 and the adhesive layer 115.

An upper portion of the adhesive member 151 may be disposed between the first and third metal layers 118 and 138. The upper portion of the adhesive member 151 may be disposed at a height equal to or lower than that of the top surface of the first support member 110. If the upper portion of the adhesive member 151 is disposed at a height higher than that of the top surface of the first support member 110, surfaces of the lead electrodes 161 and 163 may be formed to be rough.

A lower portion of the adhesive member 151 may be disposed between the second and fourth metal layers 119 and 139. The lower portion of the adhesive member 151 may be disposed at a height equal to or higher than that of the bottom surface of the first support member 110. If the lower portion of the adhesive member 151 is further protruded than the bottom surface of the first support member 110, a surface of the conductive layer 165 may be formed to be rough.

A part of the adhesive member 151 may overlap the second support member 131 in the Z-axis direction. The adhesive member 151 may not overlap or partially overlap the first support member 110 in the Z-axis direction. For example, the adhesive member 151 may be disposed on at least one of the top and bottom surfaces of at least one of the first and second support members 110 and 131. The adhesive member 151 may include any one or both of a first adhesive part 153 disposed at a top edge portion of the second support member 131 and a second adhesive part 155 disposed at a bottom edge portion of the second support member 131. The first and second adhesive parts 153 and 155 may extend an inward direction from the adhesive member 151.

The first adhesive part 153 is adhered to the top circumference of the second support member 131, and may be disposed under the circumference of the third metal layer 138 and the lead electrodes 161 and 163. The first adhesive part 153 may be adhered to the second support member 131 and the lead electrodes 161 and 163.

The first adhesive part 153 may also be exposed on the gap portion 109 as shown in FIG. 1, but the present disclosure is not limited thereto. The thickness of the first adhesive part 153 may be equal to or thinner than that of the third metal layer 138. When the thickness of the first adhesive part 153 is thicker than that of the third metal layer 138, the surfaces of the lead electrodes 161 and 163 are not uniform.

The second adhesive part 155 is adhered to the bottom circumference of the second support member 131, and may be disposed at the circumference of the fourth metal layer 139. The thickness of the second adhesive part 155 may be equal to or thinner than that of the fourth metal layer 139. When the thickness of the second adhesive part 155 is thicker than that of the fourth metal layer 139, the surface of the conductive layer 165 disposed under the second adhesive part 155 is not uniform. The second adhesive part 155 may be adhered to the second support member 131 and the conductive layer 165.

The adhesive member 151 may be made of the same material as the adhesive layer 115, and may include, for example, at least one of silicon, epoxy, and prepreg. As another example, the adhesive member 151 may be formed of a different material from the adhesive layer 115 among the above-described materials.

Meanwhile, the first lead electrode 161 is disposed on the second support member 131, and a portion of the first lead electrode 161 may extend on a second region of the first support member 110, e.g., the third electrode pattern P3 of the first metal layer 118. The second lead electrode 163 may be disposed on a first region of the first support member 110, e.g., the fourth electrode pattern P4 of the first metal layer 118, and a portion of the second lead electrode 163 may extend on the second electrode pattern P2 of the second support member 131. The first and second regions of the first support member 110 may be different regions from each other.

The first lead electrode 161 may be connected to the first electrode pattern P1 of the third metal layer 138 and the third electrode pattern P3 of the first metal layer 118. The first lead electrode 161 may be disposed to overlap with the second support member 131, the adhesive member 151, and the second region of the first support member 110 in the Z-axis direction. The light emitting chip 101 may not overlap the first support member 110 in the Z axis direction and may overlap the second support member 131 in the Z axis direction so as to have a heat radiation path in the Z axis direction.

Here, the light emitting chip 101 vertically overlap with the first lead electrode 161 and the second support member 131, and may be bonded to the first lead electrode 161 using a bonding material. When the light emitting chip 101 is bonded to the first lead electrode 161, the bonding material includes a conductive material, e.g., a solder material. When an electrical connection between the light emitting chip 101 and the first lead electrode 161 is not required, the bonding material may be an insulate material, e.g., a silicon or epoxy material.

The second lead electrode 163 may be disposed on the first region of the first support member 110, the adhesive member 151, and the second support member 131. The second lead electrode 163 may be connected to the second electrode pattern P2 of the third metal layer 138 and the fourth electrode pattern P4 of the first metal layer 118.

The first and second lead electrodes 161 and 163 are pads and may include a different metal from the first to fourth metal layers 118, 119, 138, and 139. For example, each of the first and second lead electrodes 161 and 163 may be formed in a single layer or multiple layers using at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof.

A protective layer (not shown) for surface protection may be disposed on the first and second lead electrodes 161 and 163. The protective layer may include a solder resist material.

Meanwhile, the conductive layer 165 is disposed under the second support member 131. The conductive layer 165 dissipates, under the second support member 131, heat conducted from the second support member 131. The conductive layer 165 may extend under the first support member 110. The conductive layer 165 is disposed such that its Y-axis or X-axis length is longer than the Y-axis or X-axis length of the second support member 131, thereby diffusing the conducted heat. A portion of the conductive layer 165 may overlap with the adhesive member 151 in the Z-axis direction.

The conductive layer 165 may include a different metal from the first to fourth metal layers 118, 119, 138, and 139. For example, the conductive layer 165 may be formed in a single layer or multiple layers using at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof. The conductive layer 165 may include the same metal as the first and second lead electrodes 161 and 163, but the present disclosure is not limited thereto.

The light emitting chip 101 is connected to the first and second lead electrodes 161 and 163. The light emitting chip 101 may be bonded and electrically connected to the first lead electrode 161, and may be connected to the second lead electrode 163 through the wire 105. The light emitting chip 101 is driven by receiving power supplied from the first and second lead electrodes 161 and 163, to emit light. Heat generated from the light emitting chip 101 may be conducted to the first lead electrode 161, the second support member 131, and the conductive layer 165.

According to an embodiment, the light emitting chip 101 may be disposed in one or plurality on the second support member 131, but the present disclosure is not limited thereto. The plurality of light emitting chips 101 may be connected in series or parallel, but the present disclosure is not limited thereto.

The light emitting device 100 according to the embodiment can minimize heat resistance between the light emitting chip 101 and the second support member 131 in a region in which the light emitting chip 101 is disposed. In the light emitting device 100 according to the embodiment, the second support member 131 made of a ceramic material is disposed in the region in which the light emitting chip 101 is disposed, thereby improving heat dissipation efficiency. In the light emitting device 100 according to the embodiment, the first support member 110 made of a resin material is disposed at the circumference of the second support member 131, so that an electrical connection to the rear face of the first support member 110 can be easily made through a circuit pattern or via hole on the first support member 110. In addition, other control parts may be further disposed on the first support member 110.

FIG. 4 shows an another example of the light emitting device.

Referring to FIG. 4, the light emitting device includes a first support member 110 having an opening 150, a second support member 131 located in the opening 150 of the first support member 110, a light emitting chip 101 on the second support member 131, a first lead electrode 161 disposed between the second support member 131 and the light emitting chip 101, a second lead electrode 163 disposed on at least one of the first and second support members 110 and 131, a conductive layer 165 disposed under the first and second support members 110 and 131, and a light transmission layer 171 disposed over the light emitting chip 101.

The light transmission layer 171 may be disposed on surfaces of the light emitting chip 101, e.g., side and top surfaces of the light emitting chip 101. The light transmission layer 171 may include a resin material such as silicon or epoxy.

A top surface of the light transmission layer 171 may be located at a position higher than the height of the highest point of a wire 105, but the present disclosure is not limited thereto. The light transmission layer 171 may include an impurity such as a phosphor, a dispersing agent, or a scattering agent, but the present disclosure is not limited thereto.

The light transmission layer 171 may overlap with the second support member 131 in the Z-axis direction, and a portion of the light transmission layer 171 may be formed in a gap portion 109 between the first and second lead electrodes 161 and 163. The moisture penetration through the gap portion 109 can be prevented. A portion of the light transmission layer 171 may contact over the top surface of the second support member 131. A heat radiation efficiency of the light-transmitting layer 171 can be improved.

Referring to FIG. 5, the light emitting device includes a light emitting chip 101, a first support member 110 having an opening 150, a second support member 131 located in the opening 150 of the first support member 110, the second support member 131 being disposed under the light emitting chip 101, a first lead electrode 161 disposed between the second support member 131 and the light emitting chip 101, a second lead electrode 163 disposed on at least one of the first and second support members 110 and 131, a conductive layer 165 disposed under the first and second support members 110 and 131, a phosphor layer 173 disposed on the light emitting chip 101, and a reflecting member 175 disposed at the circumferential of the light emitting chip 101.

The phosphor layer 173 is disposed on a top surface of the light emitting chip 101. The phosphor layer 173 may be further formed on side surfaces of the light emitting chip 101, but the present disclosure is not limited thereto.

The phosphor layer 173 converts wavelengths of a portion of light emitted from the light emitting chip 101. The phosphor layer 173 includes a phosphor in a silicon or epoxy resin. The phosphor may include at least one of red, green, blue, and yellow phosphors, but the present disclosure is not limited thereto. The phosphor may be formed of, for example, one selected from the group consisting of YAG, TAG, silicate, nitride, and oxy-nitride-based materials.

The reflecting member 175 may be disposed at the circumference of the light emitting chip 101 and the phosphor layer 173. The reflecting member 175 reflects light incident from the light emitting chip 101, so that light is extracted through the phosphor layer 173.

The reflecting member 175 may include a nonmetallic or insulative material, and may be formed of, for example, a resin material such as silicon or epoxy. The reflecting member 175 may include an impurity having a refractive index higher than that of the resin material. At least one of compounds, such as oxide, nitride, fluoride, and sulfide, having at least one of Al, Cr, Si, Ti, Zn, and Zr, may be added to the reflecting member 175.

A top surface of the reflecting member 175 may be located at a position higher than the height of the highest point of a wire 105. Accordingly, the reflecting member 175 can protect the wire 105. As the top surface of the reflective member 175 is flat or the distance from the light emitting chip 101 increases, the height gradually decreases or the thickness gradually decreases.

The reflecting member 175 may be disposed to overlap with the second support member 131 in the Z-axis direction, and may contact the first and second lead electrodes 161 and 163. The reflecting member 175 can dissipate heat from its surfaces through thermal conduction performed by the impurity. A portion of the reflection member 175 may not overlap or overlap with the first support member 110 in the Z-axis direction. A portion of the reflective member 175 may be disposed in the gap portion 109 and contacted with the second support member 131.

According to an embodiment, an optical lens or a optical sheet may be disposed on one or a plurality of light emitting chips 101, but the present disclosure is not limited thereto.

In the light emitting device according to the embodiment, a concave part 160 or 160A may be formed in the lead electrode 163 as shown in FIG. 7 or 8 depending on a thickness D1 of the adhesive member 151 disposed between the first and second support members 110 and 131 as shown in FIG. 6. If the concave part 160A of the lead electrode 163 is formed deeper as shown in FIG. 8, the lead electrode 163 may be open-circuited.

The thickness D1 of the adhesive member 151 may be equal to or smaller than 300 μm, e.g., in a range of 25 μm to 200 μm. When the thickness D1 of the adhesive member 151 is in the range of 25 μm to 200 μm, a fine concave part 160 may formed in the surface of the lead electrode 163 as shown in FIG. 7. The depth T2 of the concave part 160 is formed to be equal to or smaller than ⅓ of the thickness T1 of the lead electrode 163, and therefore, a failure that the lead electrode 163 is open-circuited may not occur.

If the thickness of the adhesive member 151 is less than 25 μm, any stress relief is not made in the direction of the adhesive member 151, and therefore, cracks may be generated in the second support member 131 in a thermal impact test. When the thickness D4 of the adhesive member 151 exceeds 300 μm as shown in FIG. 8, it is difficult to perform surface metal processing, and the lead electrode 163 on the adhesive member 151 has the concave part 160A caving in to a deep depth T3. Therefore, a failure that the lead electrode 163 is open-circuited.

Due to the first adhesive part 153 of the adhesive member 151, it is possible to prevent an electrical short circuit between the electrode patterns P1 and P2 at the top edge of the second support member 131. The first adhesive part 153 may have a width D3 that is equal to or greater than 50 μm, e.g., in a range of 50 µm to 150 µm. When the width D3 of the first adhesive part 153 is smaller than the range, electrical interference may occur between the adjacent patterns P1 and P2. When the width D3 of the first adhesive part 153 is greater than the range, the first adhesive part 153 may have influence on the surfaces of the lead electrodes 161 and 163.

When electrode patterns are formed on the bottom surface of the second support member 131, the second adhesive part 155 can prevent an electrical short-circuit between the electrode patterns on the bottom surface of the second support member 131. The width D2 of the second adhesive part 155 may be formed equal to or wider than the width D3 of the first adhesive part 153, and the second adhesive part 155 may have a width that is equal to or greater than 50 µm, e.g., in a range of 70 µm to 200 µm. When the width D2 of the second adhesive part 155 is smaller than the range, electrical interference may occur between the adjacent patterns P1 and P2. When the width D2 of the second adhesive part 155 is greater than the range, the second adhesive part 155 may have influence on the surface of the conductive layer 165.

FIGS. 9 to 17 are other modifications of the light emitting device of FIG. 2. In FIGS. 9 to 17, components identical to the above-described components refer to their descriptions, and their detailed descriptions will be omitted.

Referring to FIG. 9, an adhesive member 151 is disposed between a first support member 110 and a second support member 131, and includes a first adhesive part 153. The first adhesive part 153 is adhered to a top edge portion of the second support member 131, and is disposed between a third metal layer 138 and a first metal layer 118. The first adhesive part 153 can prevent first and second electrode patterns P1 and P2 from being connected to each other through a region of a gap portion 109.

The adhesive member 151 does not include a second adhesive part, and a lower portion of the adhesive member 151 may be disposed between a second metal layer 119 and a fourth metal layer 139. In this case, when a conductive layer 165 is not a power supply layer, the fourth metal layer 139 extends up to a region of the second adhesive part, and thus the thermal conduction efficiency caused by the fourth metal layer 139 can be improved.

Referring to FIG. 10, an adhesive member 151 has a structure including a second adhesive part 155 without any first adhesive part. When a conductive layer 165 is a power supply layer, the second adhesive part 155 can prevent an electrical short circuit between electrode patterns of a fourth metal layer 139 at a bottom edge portion of a second support member 131.

An upper portion of the adhesive member 151 may be disposed between a third metal layer 138 and a first metal layer 118, and a gap portion 109 may divide the third metal layer 138 into a first pattern P1 and a second pattern P2 on the second support member 131. Accordingly, although the first adhesive part of the adhesive member 151 is removed, the gap portion 109 can prevent an electrical short circuit on the second support member 131.

Referring to FIG. 11, a second support member 131 includes at least one of a first recess 6A disposed at a top edge thereof and a second recess 6B disposed at a bottom edge thereof. The first recess 6A may be disposed along the top edge of the second support member 131, and may be formed to be stepped from a top surface of the second support member 131. The second recess 6B may be formed along the bottom edge of the second support member 131, and may be formed to be stepped from a bottom surface of the second support member 131.

An adhesive member 151 is disposed between a first support member 110 and the second support member 131. A first adhesive part 154 may be disposed in the first recess 6A, and a second adhesive part 155 may be disposed in the second recess 6B.

The first adhesive part 153 may be disposed between a third metal layer 138 and a first metal layer 118, and the second adhesive part 155 may be disposed between a second metal layer 119 and a fourth metal layer 139. The first adhesive part 153 may have an increased adhesion area, and thus it is possible to prevent the occurrence of a short circuit on a top surface of the second support member 131.

The width of the first and second recesses 6A and 6B may be equal to that of the first and second adhesive parts 153 and 155, and may be, for example, in a range of 25 µm to 300 µm. By using the width of the first and second recesses 6A and 6B, it is possible to prevent interference between adjacent electrode patterns.

Referring to FIG. 12, a second support member 131 includes a first recess 6A disposed at an upper circumference thereof, and a second recess disposed at a lower circumference of the second support member 131 may be omitted. A first adhesive part 153 is disposed in the first recess 6A, and thus it is possible to prevent the occurrence of a short circuit at an upper portion of the second support member 131. Further, it is possible to improve the adhesion area between lead electrodes 161 and 163.

Referring to FIG. 13, a second recess 6B is disposed at a lower circumference of a second support member 131, and a first recess disposed at an upper circumference of the second support member 131 may be omitted. A second adhesive part 155 is disposed in the second recess 6B, and thus it is possible to prevent the occurrence of a short circuit at a lower portion of the second support member 131. Further, it is possible to improve the adhesion area with a conductive layer 165.

Referring to FIG. 14, an adhesive member 151 is disposed between first and second support members 110 and 131 in an opening 150 of the first support member 110. An upper portion of the adhesive member 151 may be disposed in a region between first and third metal layers 118 and 138 and under first and second lead electrodes 161 and 163. The upper portion of the adhesive member 151 does not include any separate adhesive part, and thus a gap portion 109 can separate electrode patterns P1 and P2 of the third metal layer 138 from each other.

A lower portion of the adhesive member 151 may be disposed in a region between second and fourth metal layers 119 and 139 and on a conductive layer 165.

Referring to FIG. 15, an adhesive member 151 is adhered between first and second support members 110 and 131, and a first recess 6A is disposed at an upper circumference of the second support member 131. A first adhesive part 154 of the adhesive member 151 may be disposed in the first recess 6A. A second recess 6B is disposed at a lower circumference of the second support member 131, and a second adhesive part 156 of the adhesive member 151 may be disposed in the second recess 6B. A protruding part 15 is disposed between the first and second recesses 6A and 6B.

Here, unlike FIG. 11, the adhesive member 151 may protrude above the top surface of the second support member 131 and may not protrude further downward of a bottom surface of the second support member 131. Accordingly, protrusions 3A and 3B of first and second lead electrodes 161 and 163 protrude to a region between first and third metal layers 118 and 138 to be adhered to the first adhesive part 154. Protrusions 5A and 5B of a conductive layer 165 protrude to a region between second and fourth metal layers 119 and 139 to be adhered to the second adhesive part 156. In the light emitting device, although the first adhesive part 154 does not protrude upward of the top surface of the second support member 131, it is possible to prevent an electrical short circuit caused by a gap portion 109.

The protrusion 15 may be disposed between the recesses 6A and 6B and disposed adjacent to the first support member 110. The distance between the protrusion 15 and the first support member 110 may be smaller than the distance between the protrusions 15 and the first support member 110 where the recesses 6A and 6B are disposed.

Referring to FIG. 16, an adhesive member 151 may be disposed between first and second support members 110 and 131. A groove 16 depressed inward on a side surface of the second support member 131, and a protruding part 152 of the adhesive member 151 may be disposed in the groove 16. The depth of the groove 16 may be formed within a range in which heat dissipation efficiency is not degraded and the strength of the second support member 131 is not degraded.

An upper portion of the adhesive member 151 may protrude upward of a top surface of the second support member 131, and a lower portion of the adhesive member 151 may protrude downward of a bottom surface of the second support member 131.

Referring to FIG. 17, an adhesive member 151 is disposed between first and second support members 110 and 131, and may include at least one or both of a first adhesive part 153A extending to a top inside of the first support member 131 and a second adhesive part 155A extending to a bottom inside of the first support member 131. The first adhesive part 153A may extend to a region adjacent to an opening in a top surface of the first support member 110, to be disposed between first and third metal layers 118 and 138. The second adhesive part 155A may extend to a region adjacent to the opening 150 in a bottom surface of the first support member 131, to be disposed between second and fourth metal layers 119 and 139.

In the light emitting device, the first and second adhesive parts 153A and 155A of the adhesive member 151 are disposed on the first support member 110, thereby improving the heat dissipation surface area of the second support member 151.

The third metal layer 138 on the second support member 131 may be divided into predetermined electrode patterns P1 and P2 by a gap portion 109. Accordingly, it is possible to prevent the occurrence of a short circuit between the electrode patterns P1 and P2 on the second support member 131.

FIG. 18 is a view showing a light emitting module having a light emitting device according to a second embodiment. FIG. 19 is a sectional view taken along line B-B of the light emitting module of FIG. 18. In FIGS. 18 and 19, components identical to the above-described components refer to the above-described components and their descriptions.

Referring to FIGS. 18 and 19, the light emitting module 100A includes a plurality of light emitting chips 101, a first support member 110 having an opening 150, a second support member 131 located in the opening 150 of the first support member 110, the second support member 131 being disposed under the light emitting chips 101, a first lead electrode 161 disposed on the second support member 131, the first lead electrode 161 being connected to the light emitting chips 101, a second lead electrode 163 disposed on at least one of the first and second support members 110 and 131, and a conductive layer 165 disposed under the first and second support members 110 and 131. According to an embodiment, an optical lens may be disposed over the plurality of light emitting chips 101, but the present disclosure is not limited thereto.

The first and second support members 110 and 131 may be formed of the same material as the above-described material. An adhesive member 151 is disposed between the first and second support members 110 and 131, and may allow the first and second support members 110 and 131 to be adhered to each other therethrough.

A first metal layer 118 may be disposed on a top surface of the first support member 110, and a second metal layer 119 may be disposed on a bottom surface of the first support member 110. Each of the first and second metal layers 118 and 119 may be divided into one or a plurality of regions as one or plurality of electrode patterns.

A plurality of electrode patterns P1 and P2 may be disposed on the second support member 131 depending on a pattern shape of a third metal layer 138. The light emitting chips 101 may be respectively disposed on first electrode patterns P1 among the plurality of electrode patterns P1 and P2, and the first electrode patterns P1 may be electrically connected to the respective light emitting chips 101. A second electrode pattern P2 among the plurality of electrode patterns P1 and P2 may be selectively connected to the first electrode patterns P1, for example, to connected through a wire 105. The plurality of light emitting chips 101 may be connected in series or parallel by the plurality of electrode patterns P1 and P2 on the second support member 131.

The first lead electrode 161 disposed on the second support member 131 may extend on a second region of the first support member 110. The second lead electrode 163 may extend from a first region of the first support member 110 to the top surface of the first support member 110. The first and second lead electrodes 161 and 163 may be selectively connected to the electrode patterns P1 and P2.

Electrode terminals 191 and 193 may be formed on the first support member 110, and at least one hole 181 or at least one via hole 183 may be disposed in a predetermined region.

A conductive layer 165 is disposed under the second support member 131. The conductive layer 165 may extend under the first support member 110. The conductive layer 165 dissipates heat conducted from the second support member 131.

A protective layer 188 may be formed on the first and second lead electrodes 161 and 163. The protective layer 188 protects the first and second lead electrodes 161 and 163, and may be formed of a solder resist material.

FIG. 20 show other examples of the light emitting module of FIG. 19.

Referring to FIG. 20, a light emitting module further includes a heat dissipation plate 210 thereunder. The heat dissipation plate 210 may be connected to a conductive layer 165 disposed under first and second support members 110 and 131. The heat dissipation plate 210 includes a support plate 211 and lower heat dissipation fins 213. The support plate 211 may be adhered to the conductive layer 165 using an adhesive, or may be fastened to a fastening member 205 through a hole 181 of the first support member 110.

A connector terminal 207 is inserted into a via hole 183 to be connected, and the connector 202 may be electrically connected to the second lead electrode 163.

A phosphor layer 173 is disposed on a light emitting chip 101. The phosphor layer 173 converts wavelengths of a portion of light emitted from the light emitting chip 101. A reflecting member 175 may be disposed at the circumference of the light emitting chip 101. The reflecting member 175 reflects light emitted in the side direction of the light emitting chip 101 to be extracted through the phosphor layer 173.

Referring to FIG. 21, a light emitting module may include control parts 201 disposed on at least one of first and second lead electrodes 161 and 163 of a first support member 110. The control parts 201 may be passive or active elements for controlling the driving of a plurality of light emitting chips 101, but the present disclosure is not limited thereto.

A protecting member 220 may be disposed over the control parts 201. The protecting member 220 may include an insulate material, e.g., an epoxy or silicon material.

A connector 202 may be connected to the light emitting module, but the present disclosure is not limited thereto.

FIG. 22 is a side cross-sectional view showing a light emitting module according to a second embodiment.

Referring to FIG. 22, a second support member 131 and a third support member 132 spaced apart from each other are included in the first support member 110. The first support member 110 may include first and second openings 150 and 150B, the second support member 131 may be disposed in the first opening 150, and the third support member 132 may be disposed in the second opening 150B. The first opening 150 has the same structure as the opening according to the above-described embodiment. Therefore, for the first opening, refer to the above-described embodiment.

The second support member 131 includes a ceramic material which is an insulating heat-dissipation material. The second support member 131 may be, for example, made of oxide, carbide or nitride obtained by combining a metal element such as silicon (Si), aluminum (Al), titanium (Ti) or zirconium (Zr) with oxygen, carbon or nitrogen. The second support member 131 may include aluminum nitride (AlN). As another example, the second support member 131 may include silicon carbide (SiC), alumina ($Al_2O_3$), zirconium oxide ($ZrO_2$), silicon nitride ($Si_3N_4$) or boron nitride (BN).

First and second lead electrodes 161 and 163 disposed on the second support member 131 may be electrically connected to the light emitting chip 101. Here, the light emitting chip 101 may be implemented as a vertical chip having an electrode, e.g., a conductive support member, at a lower portion thereof. The second support member 131 may have high thermal conductivity and can rapidly dissipate or conduct heat conducted to the first lead electrode 161 through the lower conductive support member of the light emitting chip 101. Since the second support member 131 blocks electrical conduction and thus provide a heat dissipation path of the light emitting chip 101. Therefore, the second support member 131 may be formed of a material having heat dissipation properties and non-insulation properties, e.g., a ceramic material.

The third support member 132 may be formed of a conductive material having heat dissipation properties, e.g., a metal material. The metal material may include at least one of copper (Cu), copper alloy (Cu-alloy), aluminum (Al) and aluminum-alloy (Al-alloy). The third support member 132 may include a carbon material. The third support member 132 may be formed of single-layer or multi-layer metal, without being limited thereto.

The third support member 132 may be disposed in the second opening 150B and may be in contact with the resin layers 111 and 113 of the first support member 110, without being limited thereto. The thickness of the third support member 132 may be less than that of the first support member 110. The first and second openings 151 and 151B may be vertically penetrated in different regions of the first support member 110.

Control parts 201 and 201A for controlling the light emitting chip 101 may be disposed on the first and third support members 110 and 132 and may be connected to the light emitting chip 101. The control parts 201 and 201A may include passive or active parts such as control ICs, transformers, resistors and capacitors. Among the parts, a heat generating part 201A may be disposed on the third support member 132. The heat generating part 201A may be disposed between the third support member 132 and a heat dissipation pattern 164 and may be electrically connected to fifth and sixth electrode patterns P5 and P6 adjacent to the heat dissipation pattern 164. The heat dissipation pattern 164 is electrically separated from the fifth and sixth electrode patterns P5 and P6 or the control parts 201 and 201A. The heat dissipation pattern 164 may have a larger area than the upper surface of the third support member 132 and may be disposed between the heat dissipation member 132 and the heat generating part 201A.

The heat generating part 201A does not include a separate electrode path at the lower portion thereof and thus may be electrically insulated from the heat generating pattern 164. Therefore, the third support member 132 may be electrically insulated from the heat generating part 201A and dissipate heat generated from the heat generating part 201A.

The thickness of the third support member 132 may be equal to or greater than that of the second support member 131, without being limited thereto. The thickness of the third support member 132 may be equal to or less than that of the first support member 110, without being limited thereto. The area of the upper surface of the third support member 132 may be greater than that of the lower surface of the heat generating part 201A and the size thereof may vary depending on the size of the heat generating part 201A.

The second and third support members 131 and 132 may have thicknesses enough to be exposed to the upper and lower surfaces of the first support member 110 through the first and second openings 151 and 151B of the first support member 110. The conductive layer 165 disposed under the first support member 110 may be connected to the second and third support members 131 and 132 to spread heat conducted through the second and third support members 131 and 132 to dissipate heat.

A phosphor layer 173 may be disposed on the light emitting chip 101, a reflecting member 175 may be disposed around the light emitting chip 101, and a protecting member 220 may be disposed around the reflecting member 175. The protecting member 220 may prevent the control parts 201 and 202A from being exposed.

The outer parts 21 and 22 of the protecting member 220 may be disposed around the lead electrodes 161 and 163 and the electrode patterns P5 and P6 and may be in contact with the first resin layer 111 of the first support member 110. The outer parts 21 and 22 of the protecting member 220 may prevent moisture permeation.

A via or via hole 184 may be disposed in the first support member 110, and the via or via hole 184 may connect any electrode pattern such as the sixth electrode pattern P6 with the lower electrode 166, thereby being connected to a connector 202.

FIG. 23 is a diagram showing another example of the light emitting module of FIG. 22.

Referring to FIG. 23, the light emitting module has a first opening 150 and a second opening 150B in a first support member 110, a second support member 131 is disposed in the first opening 150, and a third support member 132 is disposed in the second opening 150B.

The top-view shape of the first opening 150 is circular, polygonal or irregular, without being limited thereto. The top-view shape of the second opening 150B is circular, polygonal or irregular, without being limited thereto.

The second support member 131 may be adhered to the resin layers 111 and 113 of the first support member 110 using a first adhesive member 151 in the first opening 150. For the first adhesive member 151, refer to the description of the adhesive member disclosed in the embodiment.

A second adhesive member 151B in the second opening 150B may be disposed between a heat dissipation pattern 164 and the third conductive layer 165. The second adhesive member 151B may be in contact with the heat dissipation pattern 164 and the third conductive layer 165. The second adhesive member 151B may have the same material and shape as the adhesive members of FIGS. 2, 9 and 17, without being limited thereto.

The second support member 131 may be formed of a material having insulation properties and heat dissipation properties. For this, refer to the above description. One or a plurality of light emitting chips 101 may be disposed on the second support member 131, without being limited thereto.

The third support member 132 may be adhered to the resin layers 111 and 113 of the first support member 110 by the second adhesive member 151B in the second opening 150B. The second contact member 151B may vertically overlap the third support member 132. The second adhesive member 151B in the second opening 150B is equal to the adhesive member disclosed in the embodiment and thus, for the second adhesive member, refer to the above description. The third support member 132 may include a material having insulation properties and heat dissipation properties. One or a plurality of heat generating parts 201A may be disposed on the third support member 132, without being limited thereto.

FIGS. 24 to 30 are views showing a manufacturing process of the light emitting device of FIG. 2.

Referring to FIGS. 24 and 25, an opening 150A is formed in a first resin substrate 110A, an adhesive layer 115, and a second resin substrate 110B, and the first resin substrate 110A, the adhesive layer 115, and the second resin substrate 110B are then aligned. The first resin substrate 110A may include a first resin layer 111 and a first metal layer 118 disposed on the first resin layer 111. The second resin substrate 110B may include a second resin layer 113 and a second metal layer 119 disposed under the second resin layer 113.

The adhesive layer 115 is located between the first and second resin substrates 110A and 110B, and the first and second resin substrates 110A and 110B are then adhered to each other through the adhesive layer 115. Accordingly, the first and second resin substrates 110A and 110B can be formed as a first support member 110 as shown in FIG. 26.

In addition, a second support member 131 is located and then inserted into the opening 150A. The second support member 131 includes a ceramic material, and a metal layer 138 and 139 may be disposed on at least one of top and bottom surfaces of the second support member 131. The metal layer 138 and 139 of the second support member 131 may include electrode patterns, but the present disclosure is not limited thereto.

Top and bottom edge portions R1 and R2 of the second support member 131 may be regions in which third and fourth metal layers 138 and 139 are not formed, respectively, but the present disclosure is not limited thereto.

If the second support member 131 is disposed in the opening 150A of the first support member 110 as shown in FIG. 26, the top/bottom of the first and second support members 110 and 131 are compressed using top/bottom compression plates 251 and 156, respectively, as shown in FIG. 27.

At this time, the adhesive layer 115 disposed between the first and second resin layers 111 and 113 is compressed, to move into the opening 150, as shown in FIG. 27. An adhesive material moved into the opening 150 adheres, as an adhesive member 151, the first and second support members 110 and 131 to each other.

The adhesive member 151 extends to the top and bottom edge portions of the second support member 131, to form first and second adhesive portions 153 and 155.

Referring to FIG. 28, a lead electrode 161A and a conductive layer 165 are respectively formed on top and bottoms surfaces of the first and second support members 110 and 131 through a plating process. The lead electrode 161A may be formed in the entire region of the top surfaces of the first and second support members 110 and 131, or may be selectively formed on the top surfaces of the first and second support members 110 and 131.

Here, a hole or a via hole may be formed in the first support member 110 before the plate processing, but the present disclosure is not limited thereto.

Referring to FIGS. 28 and 29, in order to form patterns, the lead electrode 161A is etched, to form a gap portion 109, thereby dividing the lead electrode 161 into a plurality of lead electrodes 161 and 163. Also, the conductive layer 165 may be etched in a required pattern shape through an etching process, but the present disclosure is not limited thereto.

Referring to FIG. 30, a light emitting chip 101 is disposed on a first lead electrode 161 disposed on the second support member 131. The light emitting chip 101 may be bonded to the first lead electrode 161 using a bonding material, and may be electrically connected to the first and second lead electrodes 161 and 163.

Although a case where the light emitting chip 101 is a vertical type chip has been illustrated as an example, the light emitting chip 101 may be a horizontal type chip, but the present disclosure is not limited thereto. Also, the light emitting chip 101 may be mounted in a flip-chip manner, but the present disclosure is not limited thereto.

A phosphor layer or a light transmission layer may be disposed on the light emitting chip 101, and a reflecting member may be disposed at the circumference of the light emitting chip 101. However, the present disclosure is not limited thereto.

FIG. 31 is a side sectional view showing an example of a horizontal type light emitting chip according to an embodiment.

Referring to FIG. 31, the light emitting chip includes a substrate 311, a buffer layer 312, a light emitting structure 310, a first electrode 316, and a second electrode 317. The substrate 311 includes a substrate made of a light transmissive or non-light transmissive material. Also, the substrate 311 includes a conductive or insulate substrate.

The buffer layer 312 reduces a difference in lattice constant between materials of the substrate 311 and the light emitting structure 310, and may be formed of a nitride semiconductor. A nitride semiconductor layer undoped with a dopant may be further formed between the buffer layer 312 and the light emitting structure 310, thereby improving crystal quality.

The light emitting structure 310 includes a first conductive semiconductor layer 313, an active layer 314, and a second conductive semiconductor layer 315.

The first conductivity type semiconductor layer 313 is implemented using a Group III-V compound semiconductor.

The first conductive semiconductor layer 313 includes a semiconductor doped with a first conductive dopant, e.g., a compositional formula of $In_xAl_yGa_{1-x-y}N$ ($0 \le x \le 1$, $0 \le y \le 1$, $0 \le x+y \le 1$). The first conductive semiconductor layer 313 may include a stack structure of layers including at least one of compound semiconductors such as GaN, InN, AlN, InGaN, AlGaN, InAlGaN, AlInN, AlGaAs, GaP, GaAs, GaAsP, and AlGaInP. The first conductive semiconductor layer 313 is an n-type semiconductor layer, and the first conductive dopant may include, as an n-type dopant, Si, Ge, Sn, Se, and Te.

A first clad layer may be formed between the first conductive semiconductor layer 313 and the active layer 314. The first clad layer may be formed of a GaN-based semiconductor, and the bandgap of the first clad layer may be formed equal to or greater than that of the active layer 314. The first clad layer is formed of a first conductive type, and functions to restrain carriers.

The active layer 314 is disposed on the first conductive semiconductor layer 313, and selectively includes a single quantum well structure, a multiple quantum well (MQW) structure, a quantum wire structure or a quantum dot structure. The active layer 314 includes a period of a well layer and a barrier layer. The well layer may include a compositional formula of $In_xAl_yGa_{1-x-y}N$ ($0 \le x \le 1$, $0 \le y \le 1$, $0 \le x+y \le 1$), and the barrier layer may include a compositional formula of $In_xAl_yGa_{1-x-y}N$ ($0 \le x \le 1$, $0 \le y \le 1$, $0 \le x+y \le 1$). For example, the well/barrier layers may repeat with the periodicity of one or more by using a stack structure of InGaN/GaN, AlGaN/GaN, InGaN/AlGaN, InGaN/InGaN, InAlGaN/AlGaN, or InAlGaN/InAlGaN. The barrier layer may be formed of a semiconductor material having a bandgap higher than that of the well layer.

The second conductive semiconductor layer 315 is formed on the active layer 314. The second conductive semiconductor layer 315 includes a semiconductor doped with a second conductive dopant, e.g., a compositional formula of $In_xAl_yGa_{1-x-y}N$ ($0 \le x \le 1$, $0 \le y \le 1$, $0 \le x+y \le 1$). The second conductive semiconductor layer 315 may be made of any one of compound semiconductors such as GaN, InN, AlN, InGaN, AlGaN, InAlGaN, AlInN, AlGaAs, GaP, GaAs, GaAsP, and AlGaInP. The second conductive semiconductor layer 315 is a p-type semiconductor layer, and the second conductive dopant may include, as a p-type dopant, Mg, Zn, Ca, Sr, and Ba.

The second conductive semiconductor layer 315 may include a superlattice structure, and the superlattice structure may include a superlattice structure of InGaN/GaN or AlGaN/GaN. The superlattice structure of the second conductive semiconductor layer 315 diffuses a current included in an abnormal voltage, to protect the active layer 314.

Further, a conductive type of the light emitting structure 310 may be inversely disposed. For example, the first conductive semiconductor layer 313 may be prepared as the p type semiconductor layer, and the second conductive semiconductor layer 315 may be prepared as the n type semiconductor layer. In addition, a first conductive semiconductor layer having polarity opposite to the second conductive type may be further disposed on the second conductive semiconductor layer 315.

The light emitting structure 310 may have one of an n-p junction structure, a p-n junction structure, an n-p-n junction structure, and a p-n-p junction structure. Here, the p is a p type semiconductor layer, the n is an n type semiconductor layer, and the "-" denotes a structure that a p type semiconductor layer and an n type semiconductor layer make direct or indirect contact with each other. Hereinafter, for convenience of description, the uppermost layer of the light emitting structure 310 will be described as the second conductive semiconductor layer 315.

The first electrode 316 is disposed on the first conductive semiconductor layer 313. The second electrode 317 having a current diffusion layer is disposed on the second conductive semiconductor layer 315.

FIG. 32 is a view showing another example of the light emitting chip according to the embodiment. In FIG. 32, descriptions of portions identical to those of FIG. 31 are omitted and will be briefly described.

Referring to FIG. 32, in a vertical type light emitting chip, a contact layer 321 is formed under a light emitting structure 310, and a reflective layer 324 is formed under the contact layer 321. A support member 325 is formed under the reflective layer 324, and a protective layer 323 may be formed at circumferences of the reflective layer 324 and the light emitting structure 310.

The light emitting chip may be formed by forming the contact layer 321 and the protective layer 323, the reflective layer 324, and the support member 325 under a second conductive semiconductor layer 315 and then removing a growth substrate.

The contact layer 321 comes in ohmic contact with a bottom layer of the light emitting structure 310, e.g., the second conductive semiconductor layer 315. A material of the contact layer 321 may be selected from a metal oxide material, a metal nitride material, an insulative material, and a conductive material. For example, the material of the contact layer 321 may be formed of a material selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, and the selective combination thereof. Further, the material of the contact layer 321 may be formed in a multiple layer using the above metal and a light-transmissive conductive material such as IZO, IZTO, IAZO, IGZO, IGTO, AZO, and ATO. For example, the material of the contact layer 321 may be stacked in a structure such as IZO/Ni, AZO/Ag, IZO/Ag/Ni, or AZO/Ag/Ni. A layer for blocking a current to correspond to an electrode 316 may be further formed inside the contact layer 321.

The protective layer 323 may be selectively formed of a metal oxide material or an insulate material. For example, the protective layer may be formed of one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$. The protective layer 323 may be formed using a sputtering technique or a deposition technique, and a metal such as the reflective electrode layer 324 can prevent layers of the light emitting structure 310 from being short circuited.

The reflective layer 324 may be formed of a material, e.g., a material selected from the group consisting of Ag, Ni, Al, Rh, Pd, Ir, Ru, Mg, Zn, Pt, Au and Hf, and the selective combination thereof. The reflective layer 324 may be formed in a size larger than a width of the light emitting structure 310, which can improve light reflection efficiency. A metal layer for conjunction and a metal layer for thermal diffusion may be further disposed between the reflective layer 324 and the support member 325, but the present disclosure is not limited thereto.

The support member 325 may be a conductive support member and a base substrate, and may be formed of a metal such as copper (Cu), gold (Au), nickel (Ni), molybdenum (Mo) or copper-tungsten (Cu—W) or a carrier wafer (e.g., Si, Ge, GaAs, ZnO, SiC). A conjunction layer may be further formed between the support member 325 and the reflective layer 324. The conjunction layer can allow two layers to be adhered to each other. The above-described light emitting chip is and example, and is not limited to the above-described characteristics. The light emitting chip may be selectively applied to the embodiments of the light emitting device, but the present disclosure is not limited thereto.

The features, structures, effects and the like described in the embodiments are included in at least one embodiment of the present invention, and are not necessarily limited to only one embodiment. Furthermore, the features, structures, effects and the like illustrated in the embodiments can be combined and modified by other persons skilled in the art to which the embodiments belong. Therefore, it is to be understood that the present invention is not limited to these embodiments.

While the present invention has been described with reference to exemplary embodiments, it is to be understood that the invention is not limited to the disclosed exemplary embodiments. It will be apparent to those skilled in the art that various modifications and variations can be made in the present invention without departing from the spirit or scope of the invention. It can be seen that various modifications and applications are possible. For example, each component specifically shown in the embodiments can be modified and implemented. It is to be understood that the present invention may be embodied in many other specific forms without departing from the spirit or essential characteristics thereof.

INDUSTRIAL APPLICABILITY

Embodiments are applicable to a light emitting module or a lighting device including a light emitting device having improved heat dissipation efficiency.

Embodiments are applicable to various lighting devices including a light emitting device having improved heat dissipation efficiency.

Embodiments are applicable to various display devices including a light emitting device having improved heat dissipation efficiency.

The invention claimed is:

1. A light emitting module comprising:
a first support member having a top surface and a bottom surface;
a first opening and a second opening vertically penetrating from an upper portion of the first support member to a lower portion of the first support member, respectively;
a second support member disposed in the first opening of the first support member;
a third support member disposed in the second opening of the first support member;
a first adhesive member disposed in the first opening;
a first lead electrode disposed on the second support member;
a second lead electrode disposed on at least one of the first and second support members;
a light emitting chip disposed on the second support member and electrically connected to the first and second lead electrodes;
a control part disposed on the third support member; and
a conductive layer disposed under the first, second and third support members,
wherein the first support member comprises a resin material,
wherein the second support member comprises a ceramic material,
wherein the third support member comprises a metal material,
wherein the first opening and the second opening are spaced apart from each other,
wherein the second support member extends from an upper portion of the first opening to a lower portion of the first opening,
wherein the third support member extends from an upper portion of the second opening to a lower portion of the second opening,
wherein the first support member comprises a first resin layer, a second resin layer disposed on a lower surface of the first resin layer, and an adhesive layer disposed between the first and second resin layers,
wherein the first adhesive member is in contact with the first resin layer, the second resin layer, and the adhesive layer of the first support member,
wherein the first adhesive member is in contact with the first lead electrode and the conductive layer,
wherein each of the first opening and the second opening is vertically penetrated from a top surface of the first resin layer to a lower surface of the second resin layer,
wherein the first adhesive member is disposed between the first support member and side surfaces of the second support member,
wherein the third support member is electrically insulated from the control part, and
wherein an area of an upper surface of the third support member is greater than an area of a lower surface of the control.

2. The light emitting module according to claim 1, wherein the conductive layer is connected to the second and third support members, and
wherein the conductive layer is under a bottom surface of the second and third support members.

3. The light emitting module according to claim 2, further comprising a heat dissipation pattern disposed between the third support member and the control part,
wherein the heat dissipation pattern is electrically separated from the control part, and
wherein the heat dissipation pattern has an area greater than the area of the upper surface of the third support member.

4. The light emitting module according to claim 1, further comprising:
a phosphor layer disposed on the light emitting chip;
a reflecting member disposed around the light emitting chip and formed of a resin material; and
a protecting member disposed around the reflecting member and formed of a resin material,
wherein the reflecting member contacts the first lead electrode and the second lead electrode.

5. The light emitting module according to claim 1, further comprising a second adhesive member disposed in the second opening and adhered between the first support member and side surfaces of the third support member,
wherein the second adhesive member is disposed between the first support member and the side surfaces of the third support member.

6. The light emitting module according to claim 1, wherein the first adhesive member comprises at least one of a first adhesive part disposed in an outer part of an upper surface of the second support member and a second adhesive part disposed in an outer part of a lower surface of the second support member.

7. The light emitting module according to claim 1, wherein the first support member comprises a first metal layer disposed on the first resin layer and a second metal layer disposed below the second resin layer.

8. The light emitting module according to claim 7, wherein the adhesive layer and the first adhesive member comprise the same material.

9. The light emitting module according to claim 1, wherein the second support member comprises aluminum nitride, silicon carbide, alumina, zirconium oxide or boron nitride.

10. The light emitting module according to claim 1, further comprising a connector under the conductive layer.

11. A light emitting module comprising:
a first support member having a top surface and a bottom surface;
a first opening and a second opening vertically penetrating from an upper portion of the first support member to a lower portion of the first support member, respectively;
a second support member disposed in the first opening of the first support member;
a third support member disposed in the second opening of the first support member;
an adhesive member disposed in the first and second openings;
a first lead electrode disposed on the second support member;
a second lead electrode disposed on at least one of the first and second support members;
a light emitting chip disposed on the second support member and electrically connected to the first and second lead electrodes;
a control part disposed on the third support member; and
a heat dissipation pattern disposed between the third support member and the control part,
wherein the first support member comprises a resin material,
wherein the second support member comprises a ceramic material,
wherein the third support member comprises a metal material,
wherein the first support member has a multi-layer structure formed of different materials,
wherein the second and third support members have less thicknesses than the first support member,
wherein the second support member extends from an upper portion of the first opening to a lower portion of the first opening,
wherein the third support member extends from an upper portion of the second opening to a lower portion of the second opening,
wherein the first support member comprises a first resin layer, a second resin layer disposed on a lower surface of the first resin layer, and an adhesive layer disposed between the first and second resin layers,
wherein the adhesive member is in contact with the first resin layer, the second resin layer, and the adhesive layer of the first support member,
wherein each of the first opening and the second opening is vertically penetrated from a top surface of the first resin layer to a lower surface of the second resin layer,
wherein the adhesive member is adhered to the first support member, the second support member and the third support member,
wherein the adhesive member adhered to the second support member is in contact with the first lead electrode and the conductive layer,
wherein the second support member blocks an electric conduction with the light emitting chip,
wherein the third support member is electrically insulated from the control part, and
wherein an area of an upper surface of the third support member is greater than an area of a lower surface of the control part.

12. The light emitting module according to claim 11, wherein the heat dissipation pattern has an area greater than that of an upper surface of the third support member.

13. The light emitting module according to claim 12, further comprising a conductive layer disposed under the first, second and third support members,
wherein the conductive layer is connected to the second and third support members,
wherein the conductive layer contacts a lower surface of the second support member, and
wherein the conductive layer contacts a lower surface of the third support member.

14. The light emitting module according to claim 12, wherein the heat dissipation pattern is electrically separated from the control part.

15. The light emitting module according to claim 12, further comprising a phosphor layer disposed on the light emitting chip and a reflecting member disposed around the light emitting chip and formed of a resin material,
wherein the phosphor layer and the reflecting member vertically overlaps the second support member, and
wherein the reflecting member contacts the first lead electrode and the second lead electrode.

16. The light emitting module according to claim 12, wherein the adhesive member comprises:
a first adhesive member disposed in the first opening and adhered between the first support member and side surfaces of the second support member; and
a second adhesive member disposed in the second opening and adhered between the first support member and side surfaces of the third support member,
wherein the first adhesive member is disposed between the first support member and the side surfaces of the second support member,
wherein the first adhesive member extends from the upper portion of the first support member to the lower portion of the first support member, and
wherein the second adhesive member is disposed between the first support member and the side surfaces of the third support member.

17. The light emitting module according to claim 16, wherein a part of the first adhesive member vertically overlaps the second support member, and
wherein a part of the second adhesive member vertically overlaps the third support member.

18. The light emitting module according to claim 16, wherein the first support member comprises a first metal layer disposed on the first resin layer and a second metal layer disposed below the second resin layer,
wherein the adhesive layer is connected to the first adhesive member and the second adhesive member, and wherein each of the first adhesive member and the second adhesive member is in contact with the first resin layer, the second resin layer and the adhesive layer.

19. The light emitting module according to claim 11, wherein the adhesive layer and the first adhesive member comprise a same material.

20. The light emitting module according to claim 11, wherein the second support member comprises aluminum nitride, silicon carbide, alumina, zirconium oxide or boron nitride.

* * * * *